US011637137B2

(12) United States Patent
Lee et al.

(10) Patent No.: US 11,637,137 B2
(45) Date of Patent: Apr. 25, 2023

(54) PIXEL GROUP AND PIXEL ARRAY OF IMAGE SENSOR

(71) Applicant: Samsung Electronics Co., Ltd., Suwon-si (KR)

(72) Inventors: Seungjoon Lee, Busan (KR); Kyungho Lee, Suwon-si (KR); Jungbin Yun, Hwaseong-si (KR); Jihun Kim, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/392,925

(22) Filed: Aug. 3, 2021

(65) Prior Publication Data

US 2022/0199660 A1  Jun. 23, 2022

(30) Foreign Application Priority Data

Dec. 17, 2020  (KR) ........................ 10-2020-0177204

(51) Int. Cl.
*H01L 27/146*  (2006.01)
*H01L 27/148*  (2006.01)
*H04N 5/355*  (2011.01)

(52) U.S. Cl.
CPC .. *H01L 27/14603* (2013.01); *H01L 27/14621* (2013.01); *H01L 27/14627* (2013.01); *H01L 27/14831* (2013.01); *H04N 5/3559* (2013.01)

(58) Field of Classification Search
CPC ......... H01L 27/14603; H01L 27/14621; H01L 27/14627; H01L 27/14831; H04N 5/3559; H04N 5/3745
See application file for complete search history.

(56) References Cited

U.S. PATENT DOCUMENTS

| 9,609,250 | B2 | 3/2017 | Lee et al. |
| 9,748,299 | B2 | 8/2017 | Ahn et al. |
| 10,177,192 | B2 | 1/2019 | Lee |
| 10,586,818 | B2 | 3/2020 | Kato et al. |
| 10,741,593 | B1 | 8/2020 | Mabuchi et al. |
| 10,748,958 | B2 | 8/2020 | Watanabe et al. |
| 2018/0294297 | A1* | 10/2018 | Yun ................... H01L 27/14605 |
| 2019/0104261 | A1* | 4/2019 | Hatakeyama ...... H04N 5/36961 |
| 2021/0020674 | A1* | 1/2021 | Woo .................. H01L 27/14643 |

FOREIGN PATENT DOCUMENTS

KR  10-2018-0004480 A  1/2018

* cited by examiner

*Primary Examiner* — Ahmed A Berhan
(74) *Attorney, Agent, or Firm* — Harness, Dickey & Pierce, P.L.C.

(57) ABSTRACT

A pixel group of an image sensor includes first through fourth unit pixels in a matrix form of two pixels rows and two pixel columns, and a common floating diffusion region in a semiconductor substrate at a center of the pixel group and shared by the first through fourth unit pixels. Each of the first through fourth unit pixels includes a photoelectric conversion element in the semiconductor substrate, and a pair of vertical transfer gates in the semiconductor substrate and extending in a vertical direction perpendicular to a surface of the semiconductor substrate. The pair of vertical transfer gates transfer photo charges collected by the photoelectric conversion element to the common floating diffusion region. Image quality is enhanced by increasing sensing sensitivity of the unit pixel through the shared structure of the floating diffusion region and the symmetric structure of the vertical transfer gates.

20 Claims, 39 Drawing Sheets

DISTc    DISTp

PIXEL GROUP AND PIXEL ARRAY OF IMAGE SENSOR

CROSS-REFERENCE TO RELATED APPLICATION

This U.S. non-provisional application claims priority under 35 USC § 119 to Korean Patent Application No. 10-2020-0177204, filed on Dec. 17, 2020, in the Korean Intellectual Property Office (KIPO), the disclosure of which is incorporated by reference herein in its entirety.

BACKGROUND

1. Technical Field

Example embodiments relate generally to semiconductor integrated circuits, and more particularly to a pixel group and a pixel array including the pixel group of an image sensor.

2. Discussion of the Related Art

Complementary metal oxide semiconductor (CMOS) image sensors are solid-state sensing devices that use complementary metal oxide semiconductors. CMOS image sensors have lower manufacturing costs and/or lower power consumption compared with charge-coupled device (CCD) image sensors. Thus CMOS image sensors are used for various electronic appliances including portable devices such as, for example, smartphones and digital cameras.

A pixel array included in a CMOS image sensor may include a photoelectric conversion element such as a photodiode in each pixel. The photoelectric conversion element generates an electrical signal that varies based on the quantity of incident light. The CMOS image sensor processes electrical signals to synthesize an image. With the recent proliferation of high-resolution images, pixels included in the CMOS image sensor are becoming much smaller. When the pixels get smaller, incident light may not be properly sensed or noise may occur due to interference between highly integrated elements. Also the CMOS image sensor is required to have enhanced image quality and to perform additional functions other than capturing an image.

SUMMARY

Some example embodiments may provide a pixel group of an image sensor having enhanced sensing sensitivity and a pixel array including the pixel group.

According to example embodiments, a pixel group of an image sensor includes first through fourth unit pixels in a matrix form of two pixels rows and two pixel columns, and a common floating diffusion region in a semiconductor substrate at a center of the pixel group and shared by the first through fourth unit pixels. Each of the first through fourth unit pixels includes a photoelectric conversion element in the semiconductor substrate, and a pair of vertical transfer gates in the semiconductor substrate and extending in a vertical direction perpendicular to a surface of the semiconductor substrate. The pair of vertical transfer gates transfer photo charges collected by the photoelectric conversion element to the common floating diffusion region.

According to example embodiments, a pixel array of an image sensor includes a plurality of pixel groups. Each pixel group includes first through fourth unit pixels in a matrix form of two pixels rows and two pixel columns, and a common floating diffusion region in a semiconductor substrate at a center of each pixel group and shared by the first through fourth unit pixels. Each of the first through fourth unit pixels includes a photoelectric conversion element in the semiconductor substrate, and a pair of vertical transfer gates in the semiconductor substrate and extending in a vertical direction perpendicular to a surface of the semiconductor substrate.

According to example embodiments, an image sensor includes a pixel array including a plurality of pixel groups configured to collect photo charges generated by an incident light, a row driver configured to drive the pixel array row by row, and a controller configured to control the pixel array and the row driver. Each pixel group includes first through fourth unit pixels arranged in a matrix form of two pixels rows and two pixel columns and a common floating diffusion region in a semiconductor substrate at a center of each pixel group and shared by the first through fourth unit pixels. Each of the first through fourth unit pixels includes a photoelectric conversion element in the semiconductor substrate, and a pair of vertical transfer gates in the semiconductor substrate and extending in a vertical direction perpendicular to a surface of the semiconductor substrate.

The pixel array and the image sensor including the pixel group according to example embodiments may enhance an image quality by increasing sensing sensitivity of the unit pixel through the shared structure of the floating diffusion region and/or the symmetric structure of the vertical transfer gates.

In addition, the pixel group according to example embodiments may reduce cross-talk between the unit pixels and/or further enhance the image quality through the trench structure extending in the vertical direction from the upper surface of the semiconductor substrate and to the lower surface of the semiconductor substrate.

In addition, the pixel array and the image sensor including the pixel group according to example embodiments may more efficiently implement a high dynamic range (HDR) through independent driving of the two vertical transfer gates in each unit pixel.

BRIEF DESCRIPTION OF THE DRAWINGS

Example embodiments of the present disclosure will be more clearly understood from the following detailed description taken in conjunction with the accompanying drawings.

DETAILED DESCRIPTION OF EXAMPLE EMBODIMENTS

Figure 1:
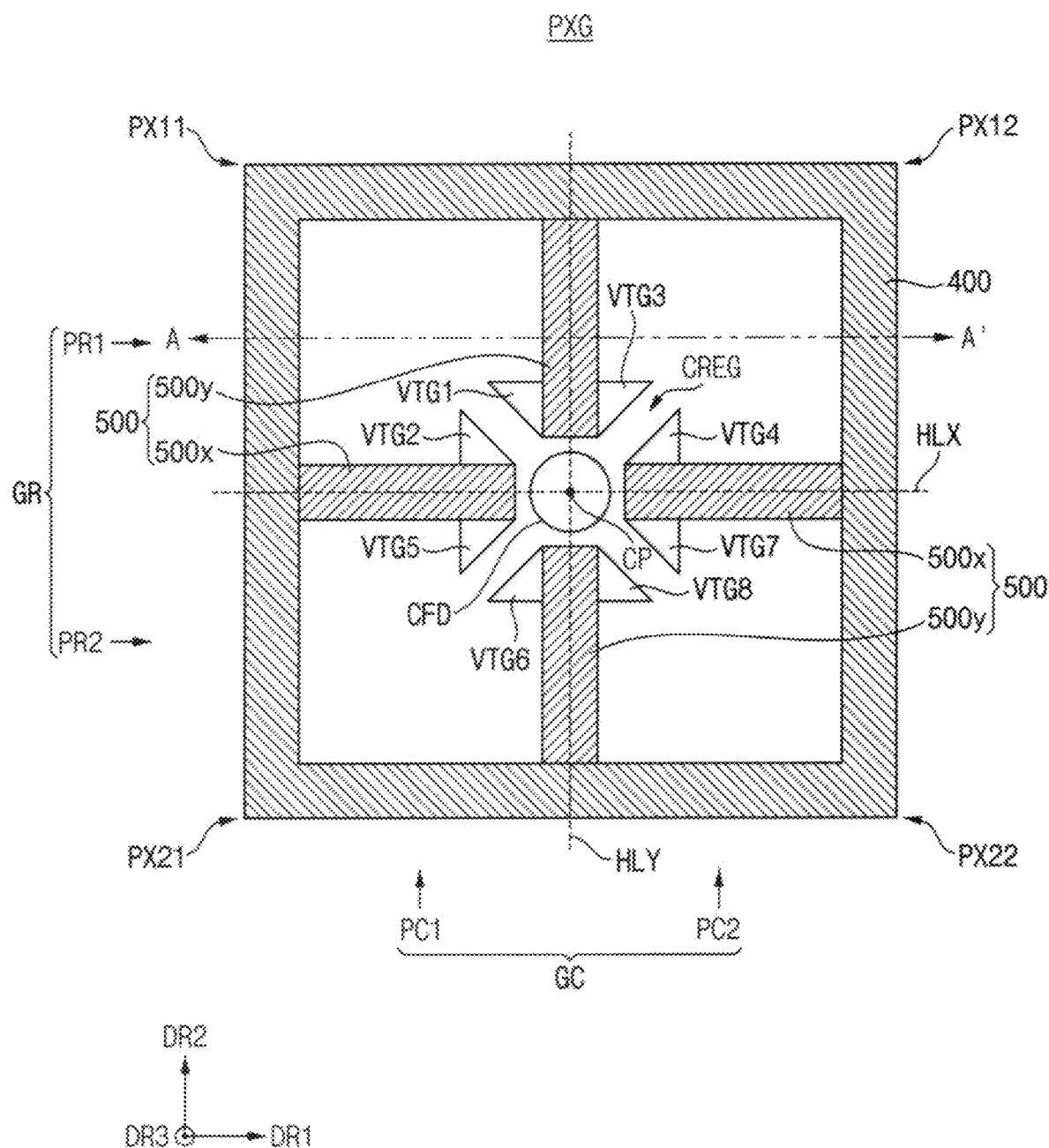
FIG. 1 is a plan view illustrating a layout of a pixel group included in an image sensor according to example embodiments.

Various example embodiments will be described more fully hereinafter with reference to the accompanying drawings, in which some example embodiments are shown. In the drawings, like numerals refer to like elements throughout. The repeated descriptions may be omitted.

Hereinafter, structures according to example embodiments are described using a first horizontal direction DR1, a second horizontal direction DR2, and a vertical direction DR3 in a three-dimensional space. The first horizontal direction DR1 and the second horizontal direction DR2 may be substantially parallel with an upper surface of a semiconductor substrate and substantially perpendicular to each other. The vertical direction DR3 may be substantially perpendicular to the upper surface of the semiconductor substrate. The first direction DR1 may be a row direction and the second direction DR2 may be a column direction.

Figure 2A:
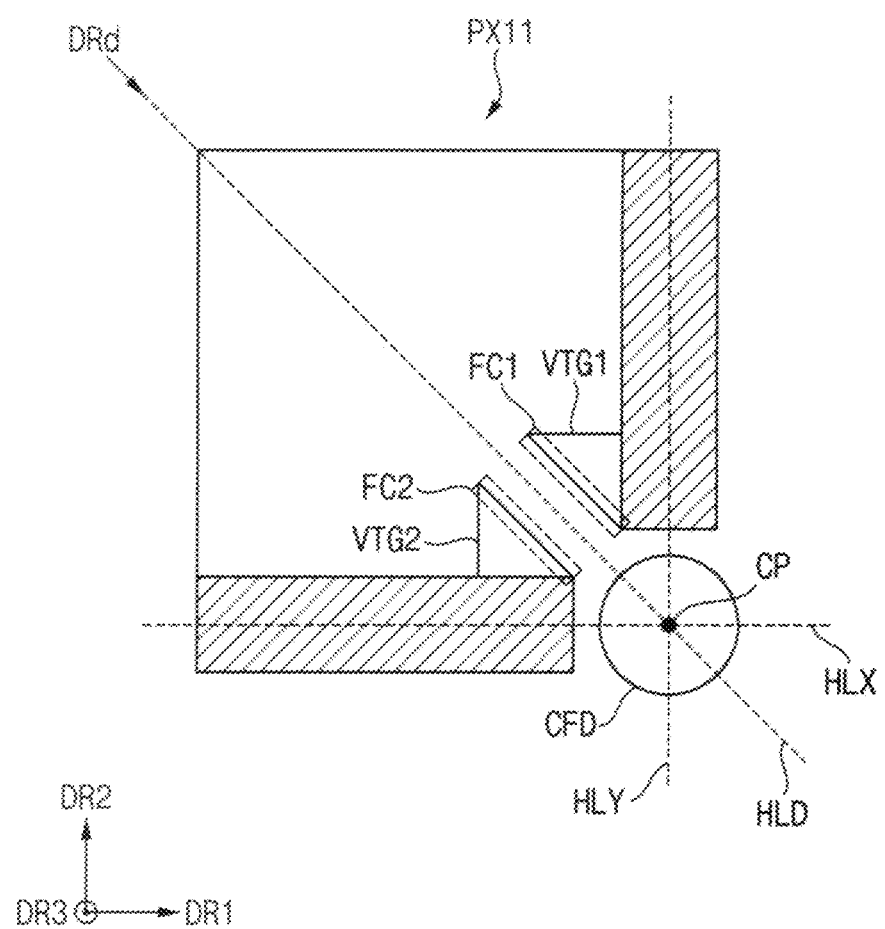
FIGS. 2A and 2B are diagrams illustrating a structure of vertical transfer gates included in the pixel group of FIG. 1.
Figure 2B:
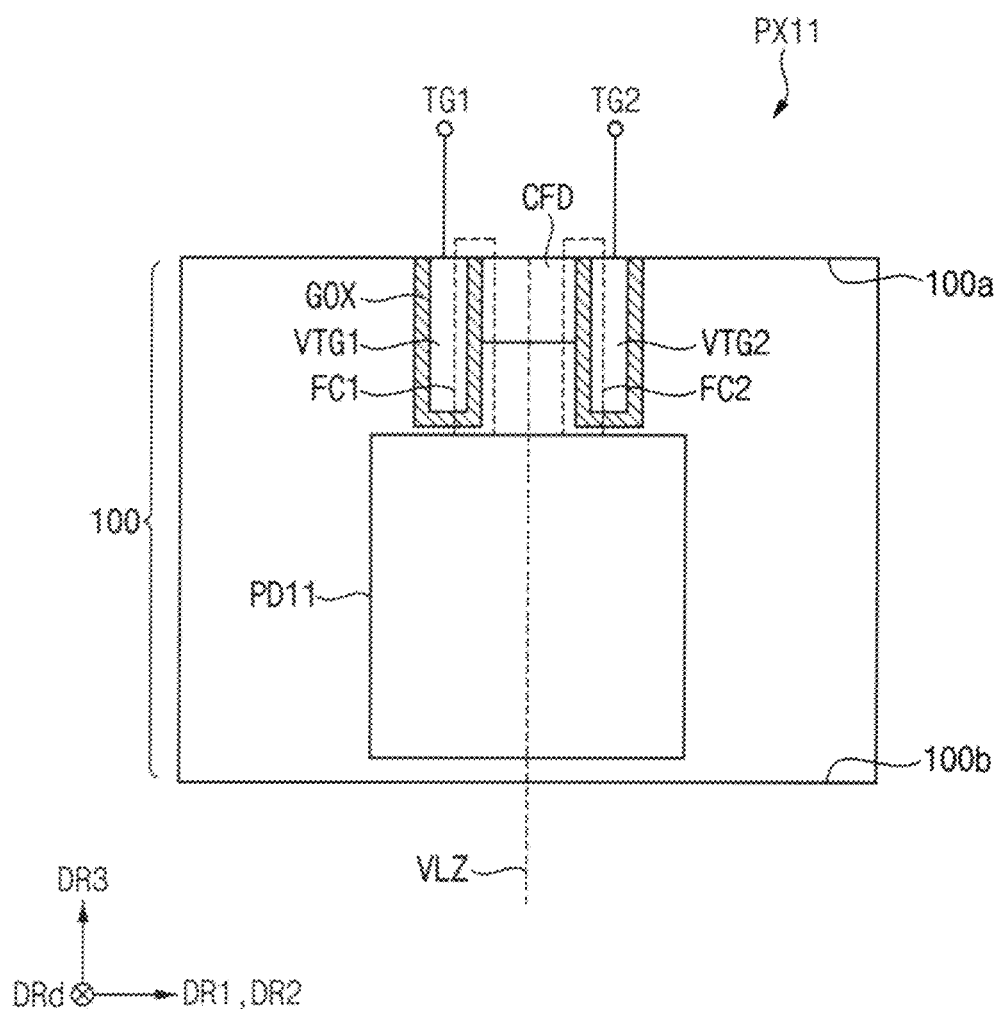

FIG. 1 is a plan view illustrating a layout of a pixel group included in an image sensor according to example embodiments, and FIGS. 2A and 2B are diagrams illustrating a structure of vertical transfer gates included in the pixel group of FIG. 1. FIG. 2A is a plan view illustrating only a first unit pixel PX11 and FIG. 2B is a cross-sectional view illustrating a vertical structure of the first unit pixel PX11 cut along a diagonal direction DRd in FIG. 2A.

Referring to FIGS. 1, 2A and 2B, a pixel group PXG may include first through fourth unit pixels PX11, PX12, PX21 and PX22 (hereinafter, which may be represented by PX11~PX22), a common floating diffusion region CFD and/or trench structures 400 and 500. In Pij, i indicates an index of a pixel row and j indicates an index of pixel column. FIG. 1 illustrates only the one pixel group PXG disposed in one group row GR and one group column GC for convenience of illustration. A plurality of pixel groups as illustrated in FIG. 1 may be arranged repeatedly in the first horizontal direction DR1 and the second horizontal direction DR2 in a matrix form of a plurality of group rows and a plurality of group columns.

The first through fourth unit pixels PX11~PX22 may be arranged in a matrix form of two pixels rows PR1 and PR2 and two pixel columns PC1 and PC2. The common floating diffusion region CFD may be disposed in a semiconductor substrate 100 at a center of the pixel group PXG and may be shared by the first through fourth unit pixels PX11~PX22.

The trench structures 400 and 500 may be disposed in the semiconductor substrate 100 and extend in the vertical direction DR3 from the upper surface 100a of the semiconductor substrate 100 and to the lower surface 100b of the semiconductor substrate 100 to electrically and optically separate the unit pixels PX11~PX22 from each other. The trench structures 400 and 500 may include inter-group trench structures 400 separating the pixel group PXG from other pixel groups and inter-pixel trench structures 500 separating the unit pixels PX11~PX22 included in the pixel group PXG from each other.

The inter-pixel trench structures 500 may include a first inter-pixel trench structure 500x and a second inter-pixel trench structure 500y. The first inter-pixel trench structure 500x may extend in the first horizontal direction DR1 to be connected to the inter-group trench structures 400 disposed at both sides of the pixel group PXG in the first horizontal direction DR1 and extend in the vertical direction DR3 from the upper surface 100a of the semiconductor substrate 100 to the lower surface 100b of the semiconductor substrate 100. The second inter-pixel trench structure 500y may extend in the second horizontal direction DR2 to be connected to the inter-group trench structures 400 disposed at both sides of the pixel group PXG in the second horizontal direction DR2 and extend in the vertical direction DR3 from the upper surface 100a of the semiconductor substrate 100 to the lower surface 100b of the semiconductor substrate 100.

The inter-pixel trench structure 500 may reduce or prevent the light incident of adjacent unit pixels from being propagated to each unit pixel. In addition, the inter-pixel trench structure 500 may reduce or prevent the photo charges generated by adjacent unit pixels from being transferred to each unit pixel. In other words, the inter-pixel trench structure 500 may reduce or prevent cross-talk between the photoelectric conversion elements PD11~PD22. In addition, the inter-group trench structure 400 may reduce or prevent cross-talk between adjacent pixel groups.

The pixel group PXG has a structure such that at least a portion of the first inter-pixel trench structure 501x and at least a portion of the second inter-pixel trench structure 501y may be removed in a cross region CREG of the first inter-pixel trench structure 501x and the second inter-pixel trench structure 501y. The electrons may overflow through the removed portion between the unit pixels PX11~PX22 and the amount of the overflowing electrons may be controlled by a potential profile in the semiconductor substrate 100.

Each of the first through fourth unit pixels PX11~PX22 may include a photoelectric conversion element disposed in the semiconductor substrate, and a pair of vertical transfer gates disposed in the semiconductor substrate 100 and extending in a vertical direction DR3. The pair of vertical transfer gates may transfer photo charges collected by the photoelectric conversion element to the common floating diffusion region CFD. The first unit pixel PX11 may include a first photodiode PD11, a first vertical transfer gate VTG1 and a second vertical transfer gate VTG2, the second unit pixel PX12 may include a second photodiode PD12 (not shown), a third vertical transfer gate VTG3 and a fourth vertical transfer gate VTG4, the third unit pixel PX21 may include a third photodiode PD21, a fifth vertical transfer gate VTG5 and a sixth vertical transfer gate VTG6, and the fourth unit pixel PX22 may include a fourth photodiode PD22 (not shown), a seventh vertical transfer gate VTG7 and a eighth vertical transfer gate VTG8.

The pixel group PXG may be symmetrical with respect to a first horizontal line HLX passing through a center CP of the pixel group PXG and extending in the first horizontal direction DR1. In addition, the pixel group PXG may be symmetrical with respect to a second horizontal line HLY passing through the center CP of the pixel group PXG and extending in the second horizontal direction DR2. According to example embodiments, the pixel group PXG may be symmetrical with a vertical line VLZ passing through the center CP of the pixel group PXG and extending in the vertical direction DR3.

Hereinafter, only the structure of the first unit pixel PX11 is further described with reference to FIGS. 2A and 2B, and the structures of the second, third and fourth unit pixels PX12, PX21 and X22 will be understood through the symmetric structure of the pixel group PXG.

The pair of vertical transfer gates included in each unit pixel may be electrically insulated from each other, and the pair of vertical transfer gates included in each unit pixel may be controlled independently of each other by a pair of transfer control signals. For example, as illustrated in FIGS. 2A and 2B, the first and second vertical transfer gates VTG1 and VTG2 may be spaced apart from each other and the surfaces of the first and second vertical transfer gates VTG1 and VTG2 within the semiconductor substrate 100 may be surrounded with gate oxide layers GOX. As will be described below with reference to FIGS. 9 through 11B, the first and second vertical transfer gates VTG1 and VTG2 may be controlled independently of each other by first and second transfer control signals TG1 and TG2, respectively.

The pair of vertical transfer gates VTG1 and VTG2 included in the pixel group PG11 may be symmetric with respect to a vertical plane passing through a diagonal line HDL in FIG. 2A. In other words, two intersection lines of a horizontal plane perpendicular to the vertical direction DR3 and two vertical surfaces FC1 and FC2 of the pair of vertical transfer gates VTG1 and VTG2 facing each other may be parallel. Through the symmetric structure of the pair of the vertical transfer gates included in each pixel group, the charge moving path from the photoelectric conversion element PD11 to the common floating diffusion region CFD may be shortened and the sensing sensitivity of the unit pixel PX11 may be enhanced.

Figure 3:
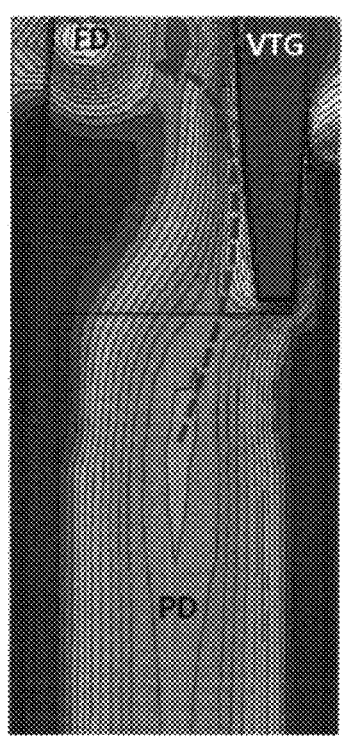
FIG. 3 is a diagram for describing a charge moving path by the vertical transfer gates included in the pixel group of FIG. 1.
Figure 3:
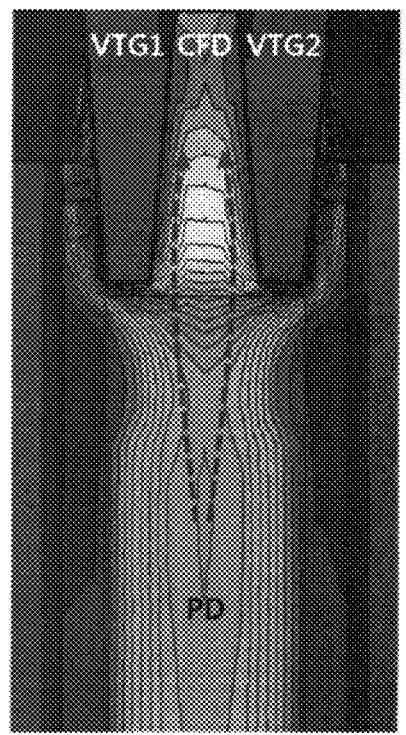

FIG. 3 is a diagram for describing a charge moving path by the vertical transfer gates included in the pixel group of FIG. 1.

FIG. 3 illustrates a first electric potential distribution DISTc of a unit pixel including one vertical transfer gate VTG and a second electric potential distribution DISTp of a unit pixel including a pair of vertical transfer gates VTG1 and VTG2 of the symmetric structure as described with reference to FIGS. 1 through 2B. In FIG. 3, the dotted arrows represent the charge moving paths.

As illustrated in FIG. 3, the electric potential is formed asymmetrically and the charge moving path from the photodiode PD to the common floating diffusion region CFD is bent and lengthened in case of the single vertical transfer gate VGT. In contrast, in case of the two symmetric vertical transfer gates VTG1 and VTG2, the electric potential may be symmetric and thus the charge moving path from the photodiode PD to the common floating diffusion region CFD may be shortened. As such, the leakage of the photo charges collected by the photodiode PD may be reduced during the transfer from the photodiode PD to the common floating diffusion region CFD and thus the sensing sensitivity may be enhanced by shortening the charge moving path using the symmetric structure of the pair of vertical transfer gates.

Figure 4A:
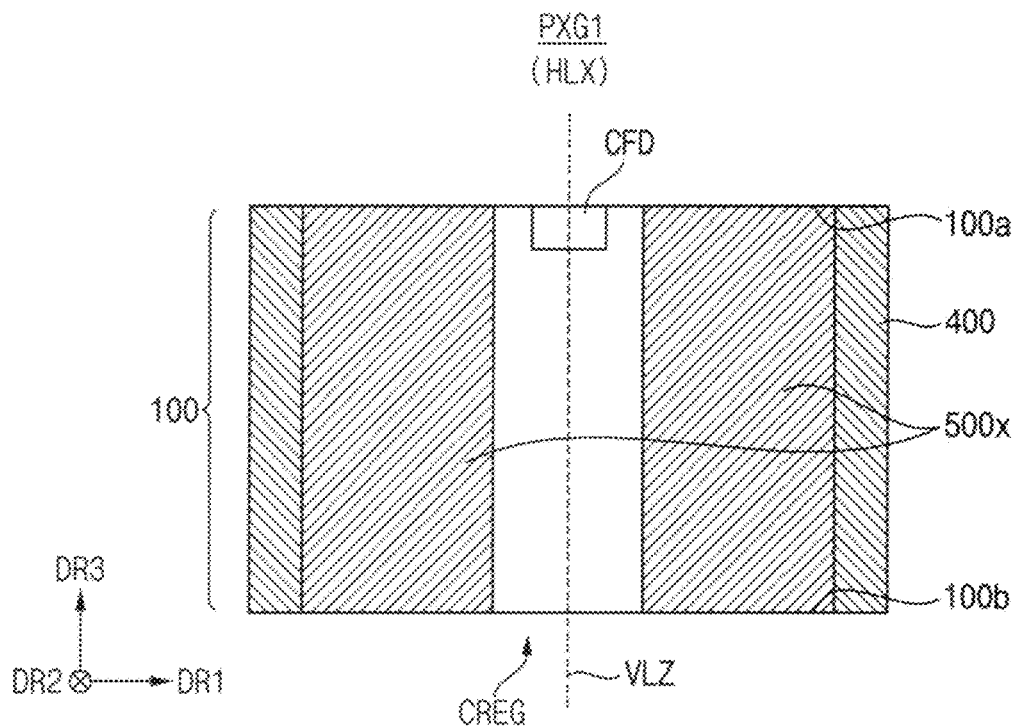
FIGS. 4A through 5B are cross-sectional views illustrating vertical structures of a pixel group included in an image sensor according to example embodiments.
Figure 4B:
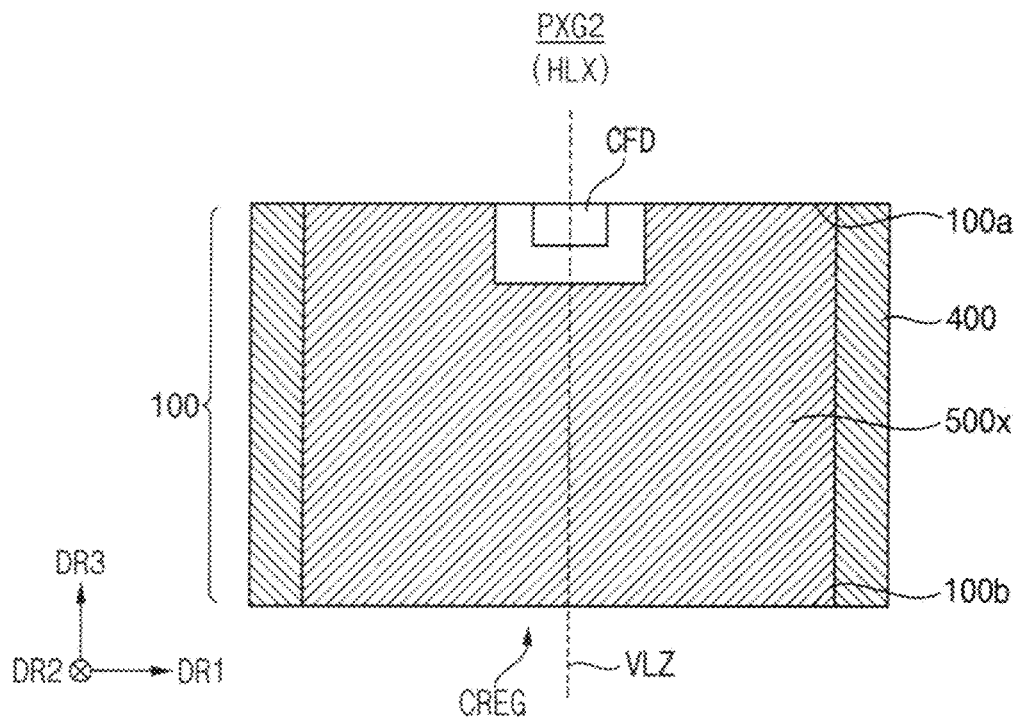
Figure 5A:
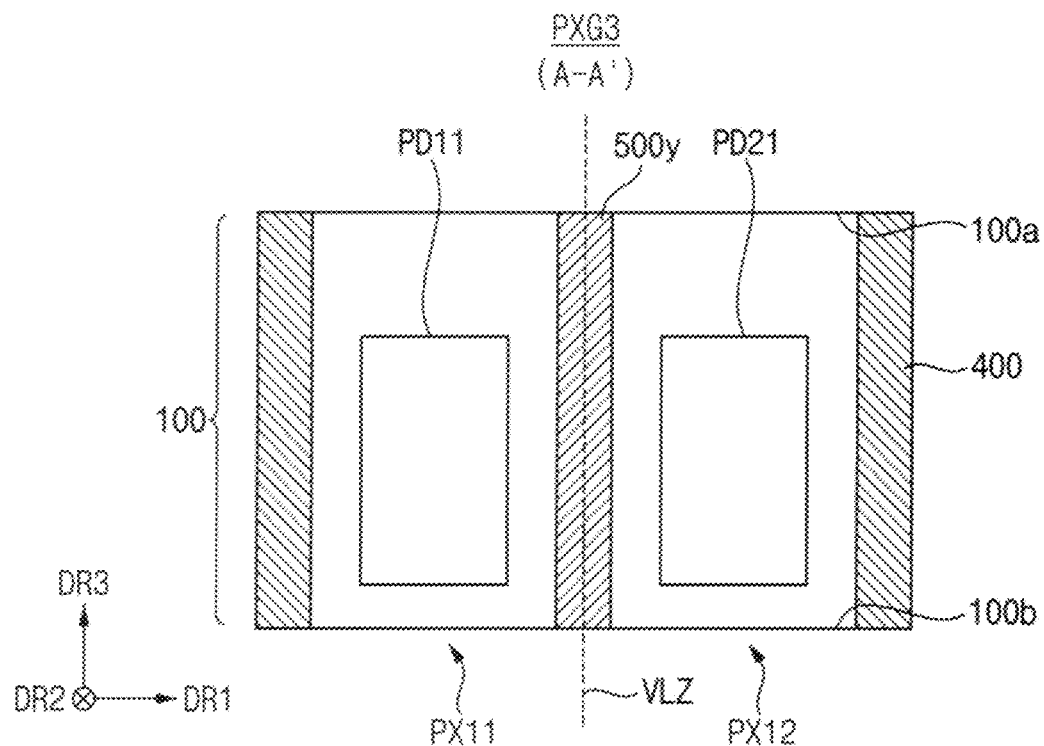
Figure 5B:
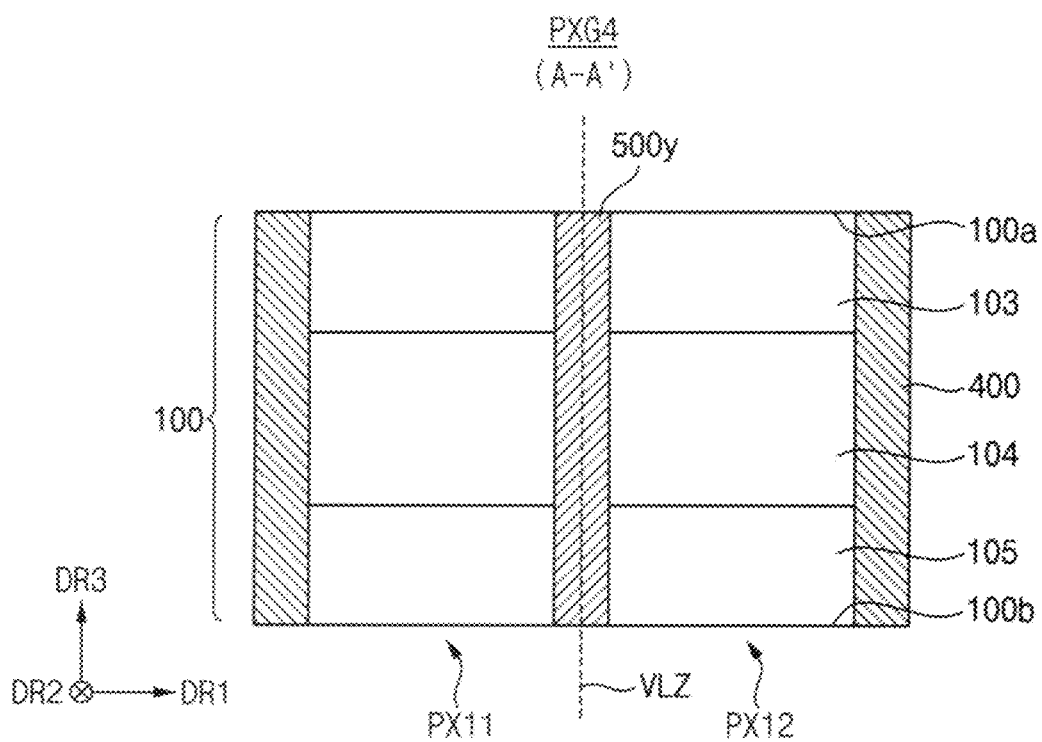

FIGS. 4A through 5B are cross-sectional views illustrating vertical structures of a pixel group included in an image sensor according to example embodiments. FIGS. 4A and 4B are cross-sectional views of the pixel group PXG of FIG. 1 along the HLX line, and FIGS. 5A and 5B are cross-sectional views of the pixel group PXG of FIG. 1 along the A-A' line. The descriptions repeated with FIGS. 1 through 2B may be omitted.

In some example embodiments, as a pixel group PXG1 illustrated in FIG. 4A, an entire portion of the first inter-pixel trench structure 500x corresponding to the cross region CREG and an entire portion of the second inter-pixel trench structure 500y corresponding the cross region CREG may be removed from the upper surface 100a of the semiconductor substrate 100 to the lower surface 100b of the semiconductor substrate 100. In some example embodiments, as a pixel group PXG2 illustrated in FIG. 4B, only a portion of the first inter-pixel trench structure 500x corresponding to the cross region CREG and only a portion of the second inter-pixel trench structure 500y corresponding to the cross region CREG may be removed near the upper surface 100a of the semiconductor substrate 100. The common floating diffusion region CFD, which are shared by the first through unit pixels PX11~PX22, may be disposed at the cross region CREG.

FIGS. 5A and 5B illustrate example embodiments of photoelectric conversion elements.

In some example embodiments, as a pixel group PXG3 illustrated in FIG. 5A, first through fourth photodiodes PD11~PD22 respectively included in the first through fourth unit pixels PX11~PX22 may be formed in the semiconductor substrate 100. For example, the semiconductor substrate 100 may be formed from a bulk silicon wafer of a first conductivity type (e.g., p-type), and the photodiodes PD11~PD22 may be doped with dopants of a second conductivity type (e.g., n-type).

In some example embodiments, as a pixel group PXG4 illustrated in FIG. 5B, the semiconductor substrate 100 may include a plurality of regions 103, 104 and 105 that are doped with impurities of the different conductivity types and/or the different concentrations. For example, in example embodiments where the semiconductor substrate 100 has p-type conductivity, the semiconductor substrate 100 may include, in order from the upper surface 100*a* of the semiconductor substrate 100, an N region 103, a P− region 104 and a P+ region 105. The N region 103 may be doped with N-type impurities and the P− and P+ regions 104 and 105 may be doped with P-type impurities. The P− region 104 is more lightly doped than the P region 103.

Photons incident on the semiconductor substrate 100 may enter the P− region 104, and may generate electron-hole pairs in the P− region 104. That is, the P− region 104 may correspond to a main photo-charge generating region where photo-charges may be mainly generated. Photo-electrons generated as minority carriers may move into a depletion region of an N-P junction at a boundary between the N region 103 and the P− region 104. Since the P+ region 105, which is heavily doped, is located below the P− region 104, the photo charges may tend to reside near the N-P junction. In some example embodiments, the N-region 103 may be replaced with a P region. In some example embodiments, the photo diode as illustrated in FIG. 5A may be formed in addition to the layered structure of FIG. 5B.

Figure 6:
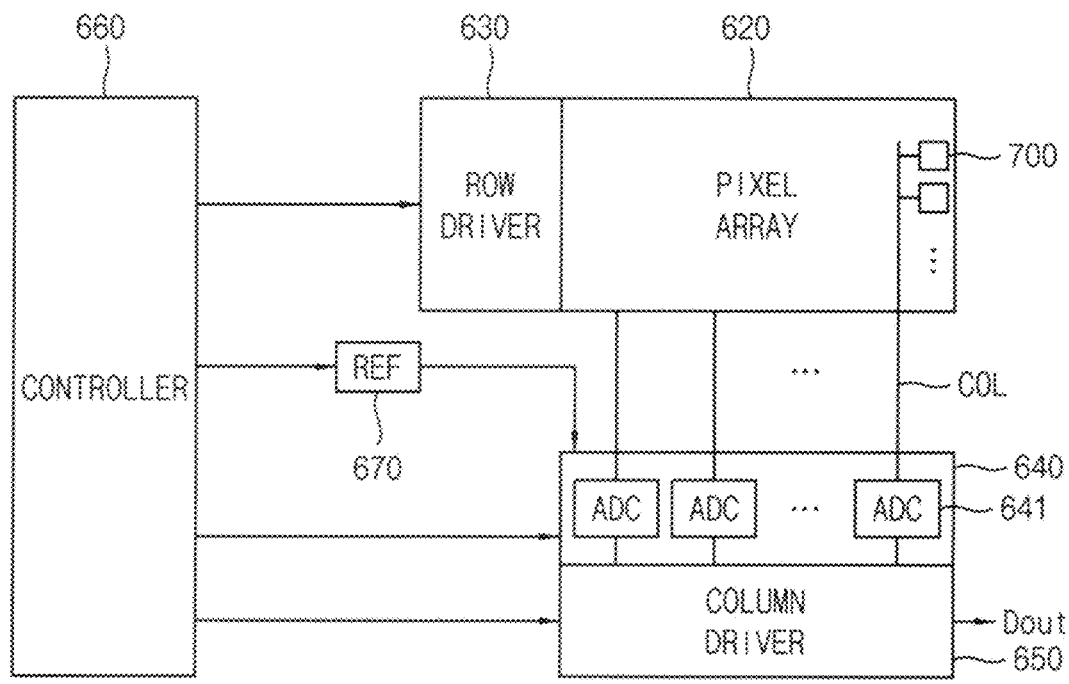
FIG. 6 is a block diagram illustrating an image sensor according to example embodiments.

FIG. 6 is a block diagram illustrating an image sensor according to example embodiments.

Referring to FIG. 6, an image sensor 600 may include a pixel array 620, a row driver 630, an analog-to-digital conversion circuit 640, a column driver 650, a controller 660, and/or a reference signal generator REF 670.

The pixel array 620 includes a plurality of pixels 700 coupled to column lines COL, respectively, and the plurality of pixels 700 senses incident light to generate analog signals through the column lines COL. The plurality of pixels 700 may be arranged in matrix form with a plurality of rows and a plurality of columns. The pixel array 620 may have a structure that various unit patterns, which will be described below with reference to FIGS. 21A through 25C, are arranged repeatedly in the first horizontal direction DR1 and the second horizontal direction DR2.

The row driver 630 may be coupled to the rows of the pixel array 620 to generate signals for driving the rows. For example, the row driver 630 may drive the pixels in the pixel array 620 row by row.

The analog-to-digital conversion circuit 640 may be coupled to the columns of the pixel array 620 to convert the analog signals from the pixel array 20 to digital signals. As illustrated in FIG. 6, the analog-to-digital conversion circuit 640 may include a plurality of analog-to-digital converters (ADC) 641 to perform analog-to-digital conversion of the analog signals output from the column lines COL in parallel or simultaneously.

The analog-to-digital conversion circuit 640 may include a correlated double sampling (CDS) unit. In some example embodiments, the CDS unit may perform an analog double sampling by extracting a valid image component based on a difference between an analog reset signal and an analog image signal. In some example embodiments, the CDS unit may perform a digital double sampling by converting the analog reset signal and the analog image signal to two digital signals and extracting a difference between the two digital signals as the valid image component. In some example embodiments, the CDS unit may perform a dual CDS by performing both the analog double sampling and digital double sampling.

The column driver 650 may output the digital signals from the analog-to-digital conversion circuit 40 sequentially as output data Dout.

The controller 660 may control the row driver 30, the analog-to-digital conversion circuit 640, the column driver 650, and/or the reference signal generator 670. The controller 660 may provide control signals such as clock signals, timing control signals, etc. required for the operations of the row driver 630, the analog-to-digital conversion circuit 640, the column driver 650, and/or the reference signal generator 670. The controller 660 may include a control logic circuit, a phase-locked loop, a timing control circuit, a communication interface circuit, etc.

The reference signal generator 670 may generate a reference signal or a ramp signal that increases or decreases gradually and provide the ramp signal to the analog-to-digital conversion circuit 40.

Figure 7:
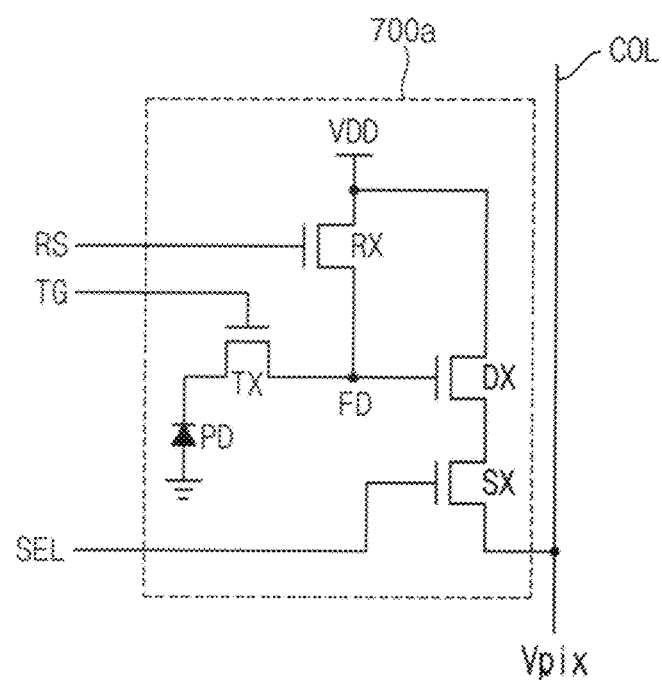
FIG. 7 is a circuit diagram illustrating an example of a unit pixel included in an image sensor according to example embodiments.

FIG. 7 is a circuit diagram illustrating an example of a unit pixel included in an image sensor according to example embodiments.

Referring to FIG. 7, a unit pixel 700*a* may include a photo-sensitive element such as a photodiode PD, and a readout circuit including a transfer transistor TX, a reset transistor RX, a drive transistor DX and/or a selection transistor SX.

For example, the photodiode PD may include an n-type region in a p-type substrate such that the n-type region and the p-type substrate form a p-n conjunction diode. The photodiode PD receives the incident light and generates a photo-charge based on the incident light. In some example embodiments, the unit pixel 600*a* may include a phototransistor, a photogate, and/or a pinned photodiode, etc. instead of, or in addition to, the photodiode PD.

The photo-charge generated in the photodiode PD may be transferred to a floating diffusion node FD through the transfer transistor TX. The transfer transistor TX may be turned on in response to a transfer control signal TG.

The drive transistor DX functions as a source follower amplifier that amplifies a signal corresponding to the charge on the floating diffusion node FD. The selection transistor SX may transfer the pixel signal Vpix to a column line COL in response to a selection signal SEL.

The floating diffusion node FD may be reset by the reset transistor RX. For example, the reset transistor RX may discharge the floating diffusion node FD in response to a reset signal RS for correlated double sampling (CDS).

FIG. 7 illustrates the unit pixel 700*a* of the four-transistor configuration including the four transistors TX, RX, DX and SX. The configuration of the unit pixel may be variously changed and the pixel structure is not limited to that of FIG. 7.

Figure 8:
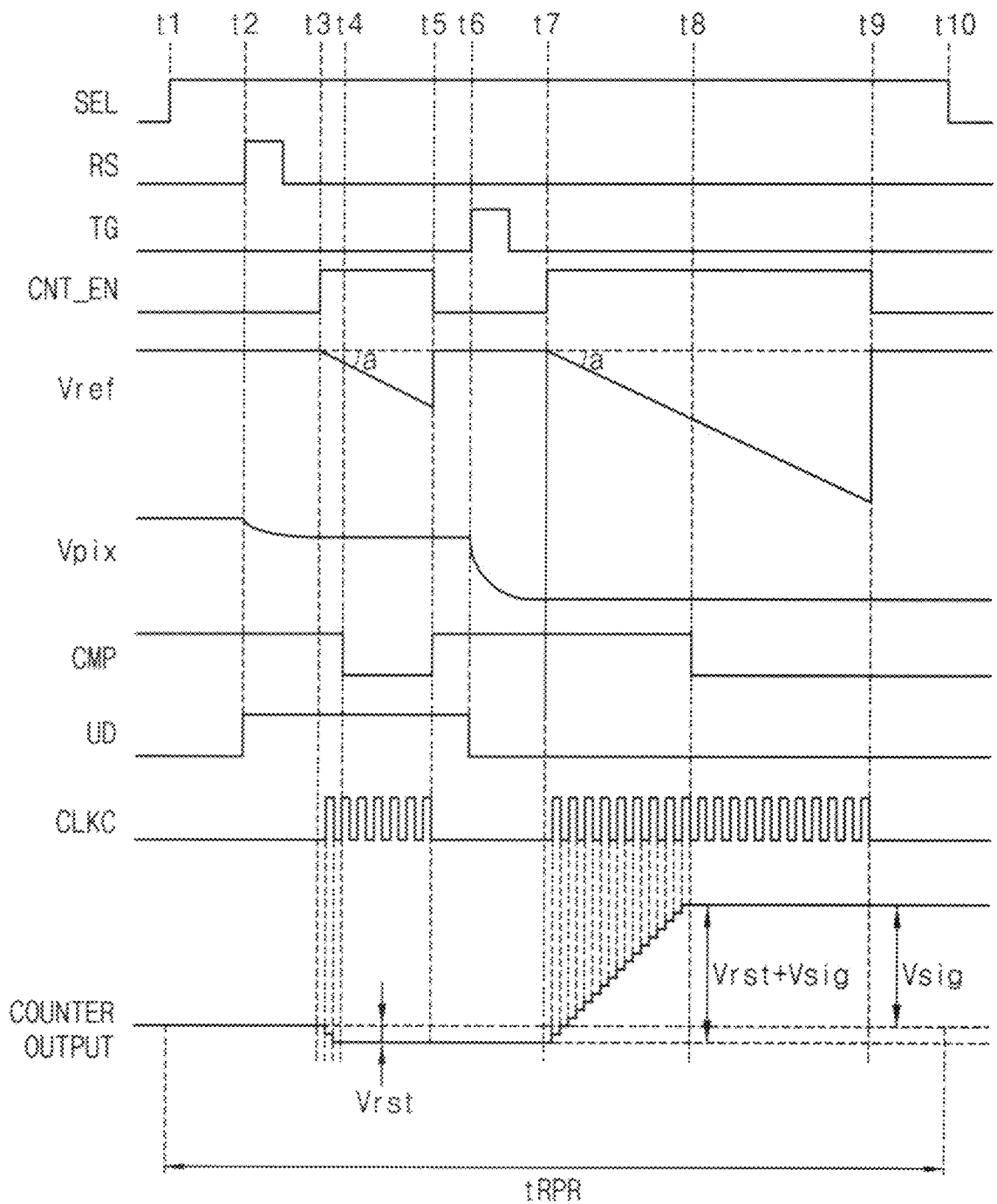
FIG. 8 is a timing diagram illustrating an example operation of an image sensor according to example embodiments.

FIG. 8 is a timing diagram illustrating an example operation of an image sensor according to example embodiments.

FIG. 8 illustrates a sensing period tRPR corresponding to a sensing operation of a pixel. The sensing operation may be performed simultaneously with respect to pixels corresponding to the same transfer control signal TG.

Referring to FIGS. 6, 7 and 8, at a time t1, the row driver 630 may select one of rows included in the pixel array 20 by providing an activated row selection signal SEL to the selected row of the pixel array 620.

At a time t2, the row driver 630 may provide an activated reset control signal RS to the selected row, and the controller 60 may provide an up-down control signal UD having a logic high level to a counter included in the ADC 641. From the time t2, the pixel array 620 may output a first analog signal corresponding to a reset component Vrst as the pixel voltage Vpix.

At a time t3, the controller 660 may provide a count enable signal CNT_EN having a logic high level to the reference signal generator 670, and the reference signal generator 670 may start to decrease the reference signal Vref at the constant rate, e.g., a slope of 'a'. The controller 660 may provide a count clock signal CLKC to the counter, and the counters may perform down-counting from zero in synchronization with the count clock signal CLKC.

At a time t4, a magnitude of the reference signal Vref may become smaller than a magnitude of the pixel voltage Vpix, and a comparator included in the ADC 641 may provide a comparison signal CMP having a logic low level to the counter so that the counter stops performing the down-counting. At the time t4, a counter output of the counter may be the first counting value that corresponds to the reset component Vrst. In the example of FIG. 8, the counter output of the counter at the time t4 may be −2.

At a time t5, the controller 660 may provide the count enable signal CNT_EN having a logic low level to the reference signal generator 670, and the reference signal generator 670 may stop generating the reference signal Vref.

A period from the time t3 to the time t5 corresponds to a maximum time for detecting the reset component Vrst. A length of the period from the time t3 to the time t5 may be determined as a certain number of the count clock signal CLKC according to a characteristic of the image sensor 700.

At a time t6, the row driver 630 may provide an activated transfer control signal TG (e.g., the transfer control signal TG having a logic high level) to the selected row, and the controller 660 may provide the up-down control signal UD having a logic low level to the counter. From the time t6, the pixel array 620 may output a second analog signal AS2 corresponding to a detected incident light Vrst+Vsig as the pixel voltage Vpix.

At a time t7, the controller 660 may provide the count enable signal CNT_EN having a logic high level to the reference signal generator 670, and the reference signal generator 670 may start to decrease the reference signal Vref at the same constant rate as at the time t3, e.g., a slope of 'a'. The comparator may provide the comparison signal CMP having a logic high level to the counter since the pixel voltage Vpix is smaller than the reference signal Vref. The controller 660 may provide the count clock signal CLKC to the counter, and the counter may perform an up-counting from the first counting value, which corresponds to the reset component Vrst, in synchronization with the count clock signal CLKC.

At a time t8, the magnitude of the reference signal Vref may become smaller than the magnitude of the pixel voltage Vpix, and the comparator may provide the comparison signal CMP having a logic low level to the counter so that the counter stops performing the up-counting. At the time t8, the counter output of the counter may correspond to a difference between the first analog signal representing the reset component Vrst (e.g., −2 in the example of FIG. 8) and the second analog signal representing the detected incident light Vrst+Vsig (e.g., 17 in the example of FIG. 8). The difference may be an effective intensity of incident light Vsig (e.g., 15 in the example of FIG. 8). The counter may output the effective intensity of incident light Vsig as the digital signal.

At a time t9, the controller 660 may provide the count enable signal CNT_EN having a logic low level to the reference signal generator 670, and the reference signal generator 670 may stop generating the reference voltage Vref.

A period from the time t7 to the time t9 corresponds to a maximum time for detecting the detected incident light Vrst+Vsig. A length of the period from the time t7 to the time t9 may be determined as a certain number of the count clock signal CLKC according to a characteristic of the image sensor 700.

At a time t10, the row driver 630 may provide a deactivated row selection signal SEL (e.g., the row selection signal having a low level) to the selected row of the pixel array 620, and the counter may reset the counter output to zero.

After that, the image sensor 700 may repeat above described operations on each row to generate the digital signals row by row.

The inventive concepts are not limited to the example configuration and operation described with reference to FIGS. 6, 7 and 8.

Figure 9:
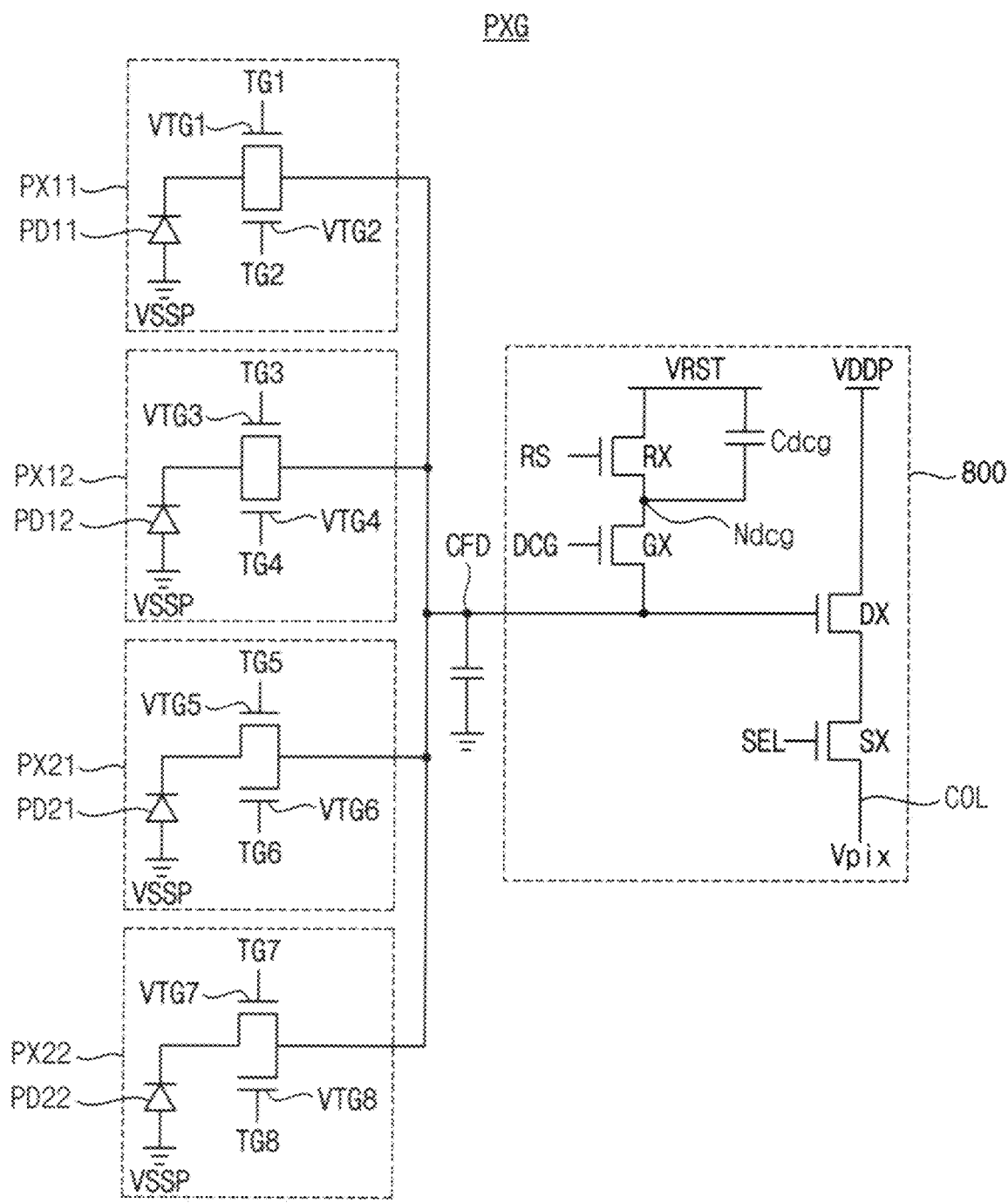
FIG. 9 is a circuit diagram illustrating a shared structure of a pixel group sharing a floating diffusion region included in an image sensor according to example embodiments.
Figure 10:
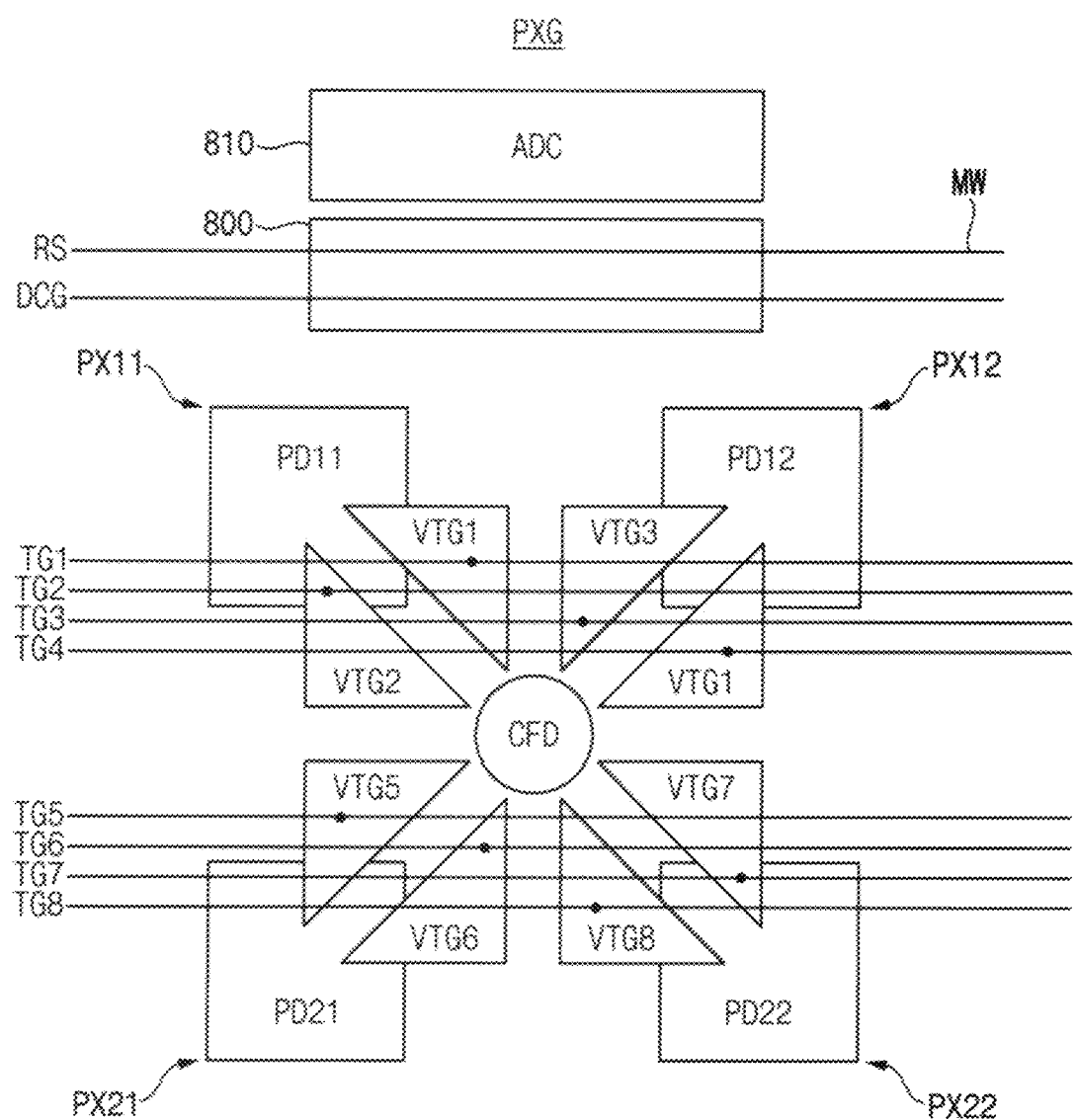
FIG. 10 is a top view illustrating an example layout of the shared structure of FIG. 9.

FIG. 9 is a circuit diagram illustrating a shared structure of a pixel group sharing a floating diffusion region included in an image sensor according to example embodiments, and FIG. 10 is a top view illustrating an example layout of the shared structure of FIG. 9.

Referring to FIGS. 9 and 10, a pixel group PXG may include a common floating diffusion region CFD, a first unit pixel PX11, a second unit pixel PX12, a third unit pixel PX21, a fourth unit pixel PX22 and a readout circuit 800. In some example embodiments, the pixel group PXG may further include an analog-to-digital conversion unit ADC 810. The first unit pixel PX11, the second unit pixel PX12, the third unit pixel PX21, and/or the fourth unit pixel PX22 may be commonly connected to the common floating diffusion region CFD.

Control signals TG1~TG8, RS and DCG may be provided from the row driver (e.g., the row driver 630 in FIG. 6) to the unit pixel group UPG through wires MW extended in the first horizontal direction DR1.

The first unit pixel PX11 may include a first photodiode PD11, a first vertical transfer gate VTG1 and a second vertical transfer gate VTG2, the second unit pixel PX12 may include a second photodiode PD12, a third vertical transfer gate VTG3 and a fourth vertical transfer gate VTG4, the third unit pixel PX21 may include a third photodiode PD21, a fifth vertical transfer gate VTG5 and a sixth vertical transfer gate VTG6, and the fourth unit pixel PX22 may include a fourth photodiode PD22, a seventh vertical transfer gate VTG7 and a eighth vertical transfer gate VTG8.

The readout circuit 800 may include a reset transistor RX, a gain adjusting transistor GX, a capacitor Cdcg, a source follower transistor or a driving transistor DX, and/or a selection transistor SX. FIG. 9 illustrates a non-limiting example where each unit pixel includes one transistor and the readout circuit includes four transistors, but example embodiments may be applied to operate an image sensor of various configurations other than that of FIG. 9.

The reset transistor RX may be connected between a reset voltage VRST and a gain adjusting node Ndcg and the reset transistor RX may be turned on and off in response to a reset signal RS. The gain adjusting transistor GX may be connected between the gain adjusting node Ndcg and the common floating diffusion node FD and the gain adjusting transistor GX may be turned on and off in response to a gain adjusting signal DCG. The capacitor Cdcg may be connected in parallel with the reset transistor RX between the reset voltage VRST and the gain adjusting node Ndcg. As will be described with reference to FIG. 12, different gains may be implemented using the gain adjusting transistor CX and the capacitor Cdcg.

Figure 11A:
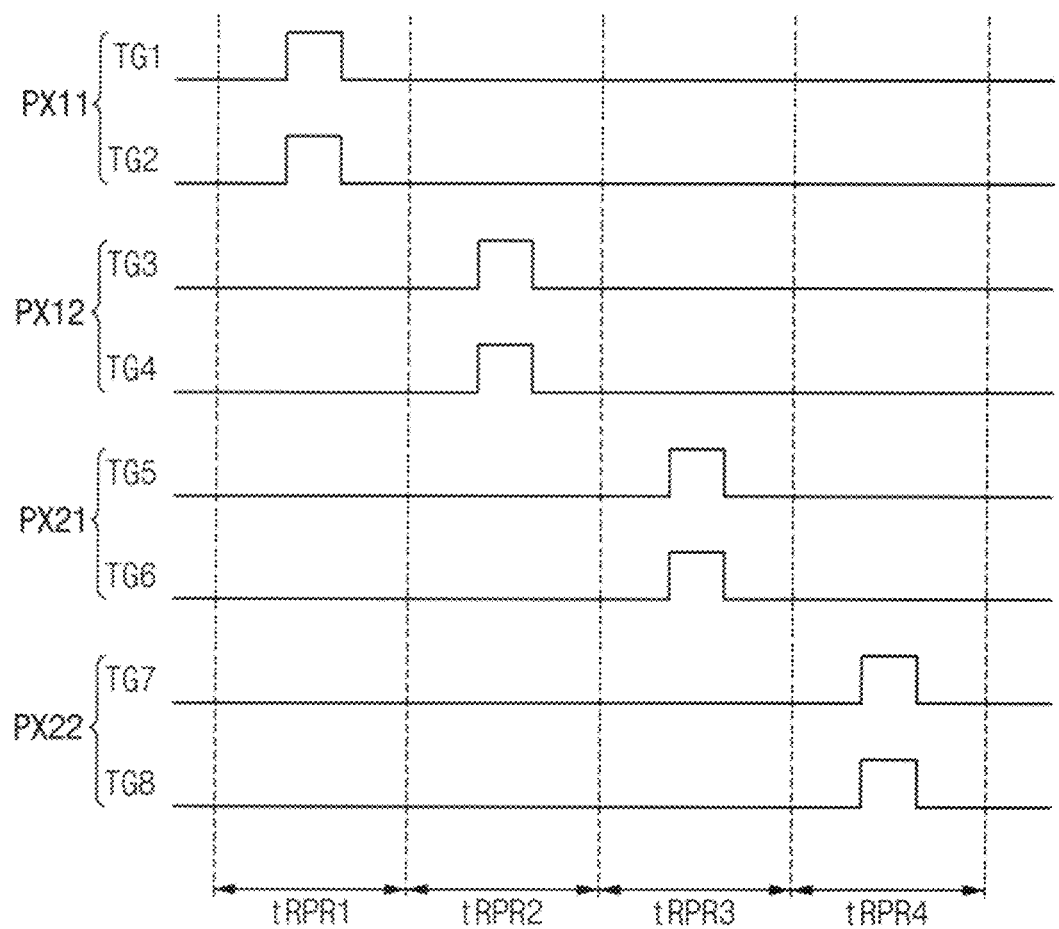
FIGS. 11A and 11B are timing diagrams illustrating an operation of the pixel group having the shared structure of FIG. 9.
Figure 11B:
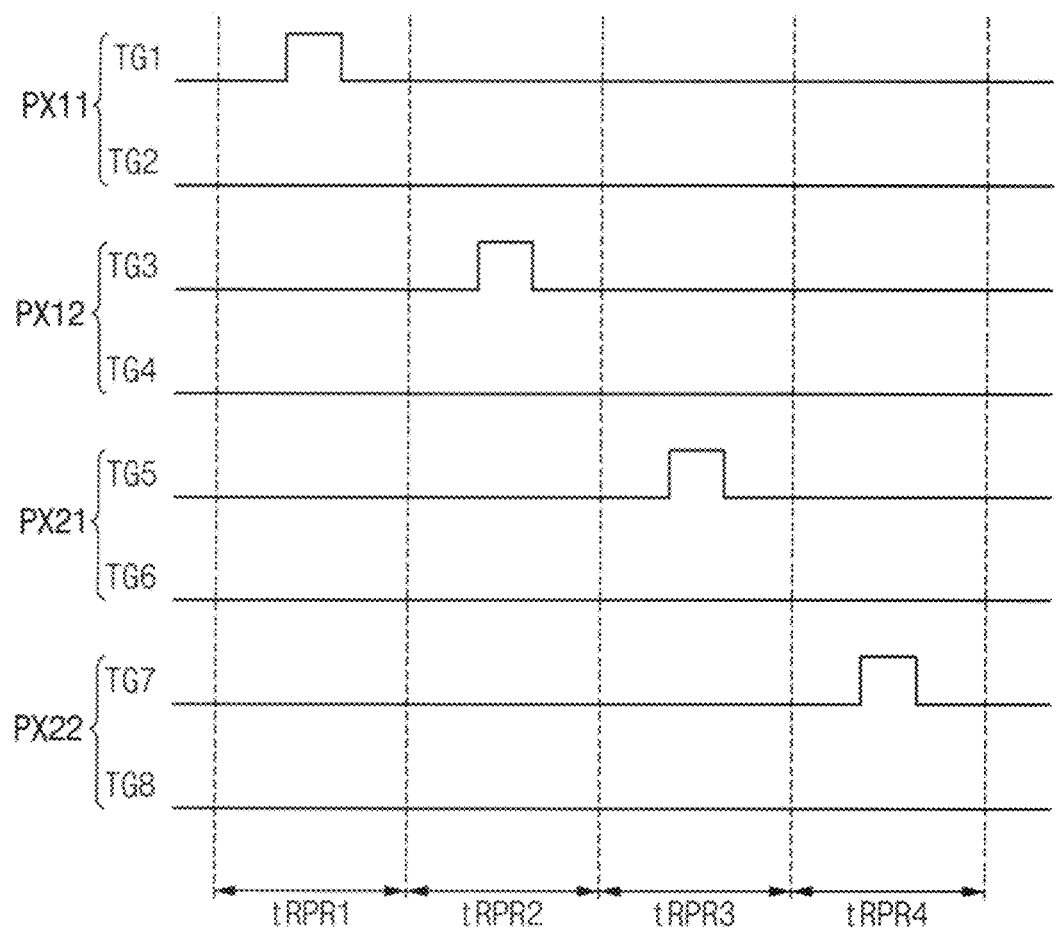

FIGS. 11A and 11B are timing diagrams illustrating an operation of the pixel group having the shared structure of FIG. 9.

FIGS. 11A and 11B illustrate first through fourth sensing periods tRPR1~tRPR4. Each sensing period is the same as described with reference to FIG. 8, and FIGS. 11A and 11B illustrate only the transfer control signals for convenience of illustration.

Referring to FIGS. 9 through 11B, the first through eighth vertical transfer gates VTG1~VTG8 may be controlled respectively by first through fourth transfer control signals TG1~TG8, which are activated independently. The first and second vertical transfer gates VGT1 and VGT2 of the first unit pixel PX11 may be controlled independently of each other respectively by the first and second transfer control signals TG1 and TG2. The third and fourth vertical transfer gates VGT3 and VGT4 of the second unit pixel PX12 may be controlled independently of each other respectively by the third and fourth transfer control signals TG3 and TG4. The fifth and sixth vertical transfer gates VGT5 and VGT6 of the third unit pixel PX21 may be controlled independently of each other respectively by the fifth and sixth transfer control signals TG5 and TG6. The seventh and eighth vertical transfer gates VGT7 and VGT8 of the fourth unit pixel PX22 may be controlled independently of each other respectively by the seventh and sixth transfer control signals TG7 and TG8.

In some example embodiments, as illustrated in FIG. 11A, the pair of vertical transfer gates included in each unit pixel may be activated simultaneously to perform a low-luminance sensing. In the low-luminance environment of the image sensor, the pair of the vertical transfer gates may be activated to increase the amount of charges transferred from each photodiode to the common floating diffusion region CFD and accurately sense the incident light of the low luminance.

In some example embodiments, as illustrated in FIG. 11B, only one of the pair of vertical transfer gates may be activated to perform a high-luminance sensing. In the high-luminance environment of the image sensor, only one of the pair of the vertical transfer gates may be activated to decrease the amount of charges transferred from each photodiode to the common floating diffusion region CFD and reduce or prevent the common floating diffusion region CFD from being saturated.

As such, the pixel array and the image sensor including the pixel group according to example embodiments may more efficiently implement a high dynamic range (HDR) through independent driving of the two vertical transfer gates in each unit pixel.

Figure 12:
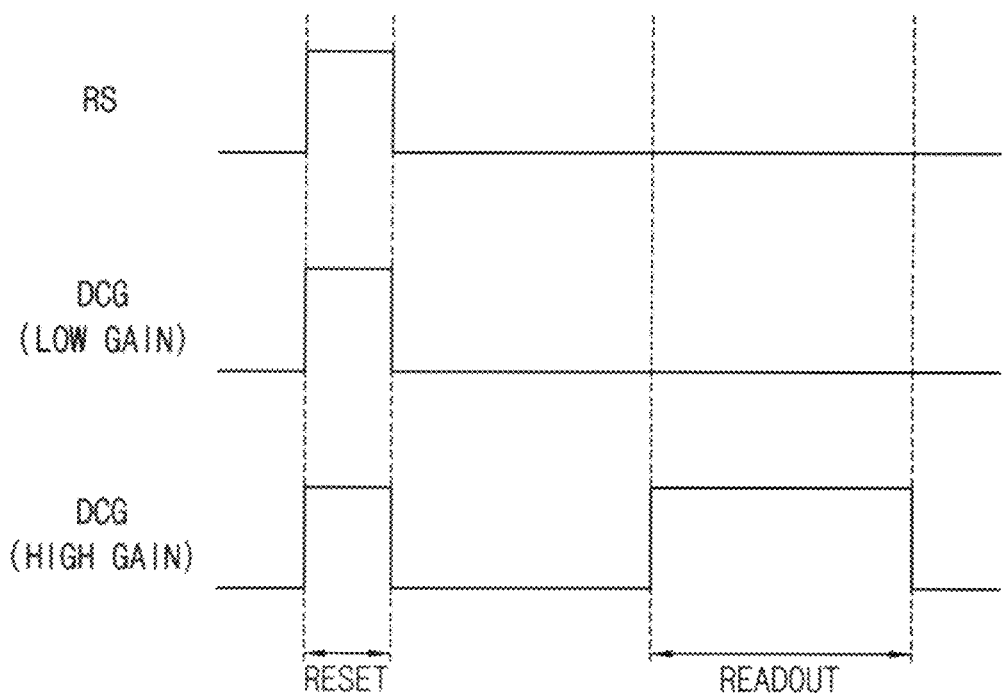
FIG. 12 is a timing diagram illustrating an operation according to a gain in the shared structure of FIG. 9.

FIG. 12 is a timing diagram illustrating an operation according to a gain in the shared structure of FIG. 9.

Referring to FIGS. 9, 10 and 12, the reset transistor RX and the gain adjusting transistor GX may be turned on when the common floating diffusion node FD is reset. The reset transistor RX may be turned off and the gain adjusting transistor GX may be turned on when a voltage of the common floating diffusion node FD is read out with a first gain (e.g., low gain). The reset transistor RX and the gain adjusting transistor GX may be turned off when the voltage of the common floating diffusion node FD is read out with a second gain (e.g., high gain) higher than the first gain.

The pixel signal Vpix output from the pixel array may include a shot noise that increases according to an ambient light and a circuit noise caused by characteristics of internal circuits of the pixel array. Even though the gain of the pixel is increased using the gain adjusting transistor GX and the capacitor Cdcg as illustrated in FIG. 9, and the noise is increased, the increase of the signal-to-noise ratio (SNR) is insignificant.

According to example embodiments, the shot noise and/or the circuit noise of the target color pixels (e.g., the blue color pixels) may be reduced and the sensing sensitivity of the target color pixels may be enhanced.

Hereinafter, example embodiments are described based on structures corresponding to a back-side illumination (BSI) such that a light is incident through a lower surface of a semiconductor substrate, and it will be understood that example embodiments may be applied to structures corresponding to a front-side illumination (FSI) such that a light is incident through an upper surface of a semiconductor substrate.

Figure 13:
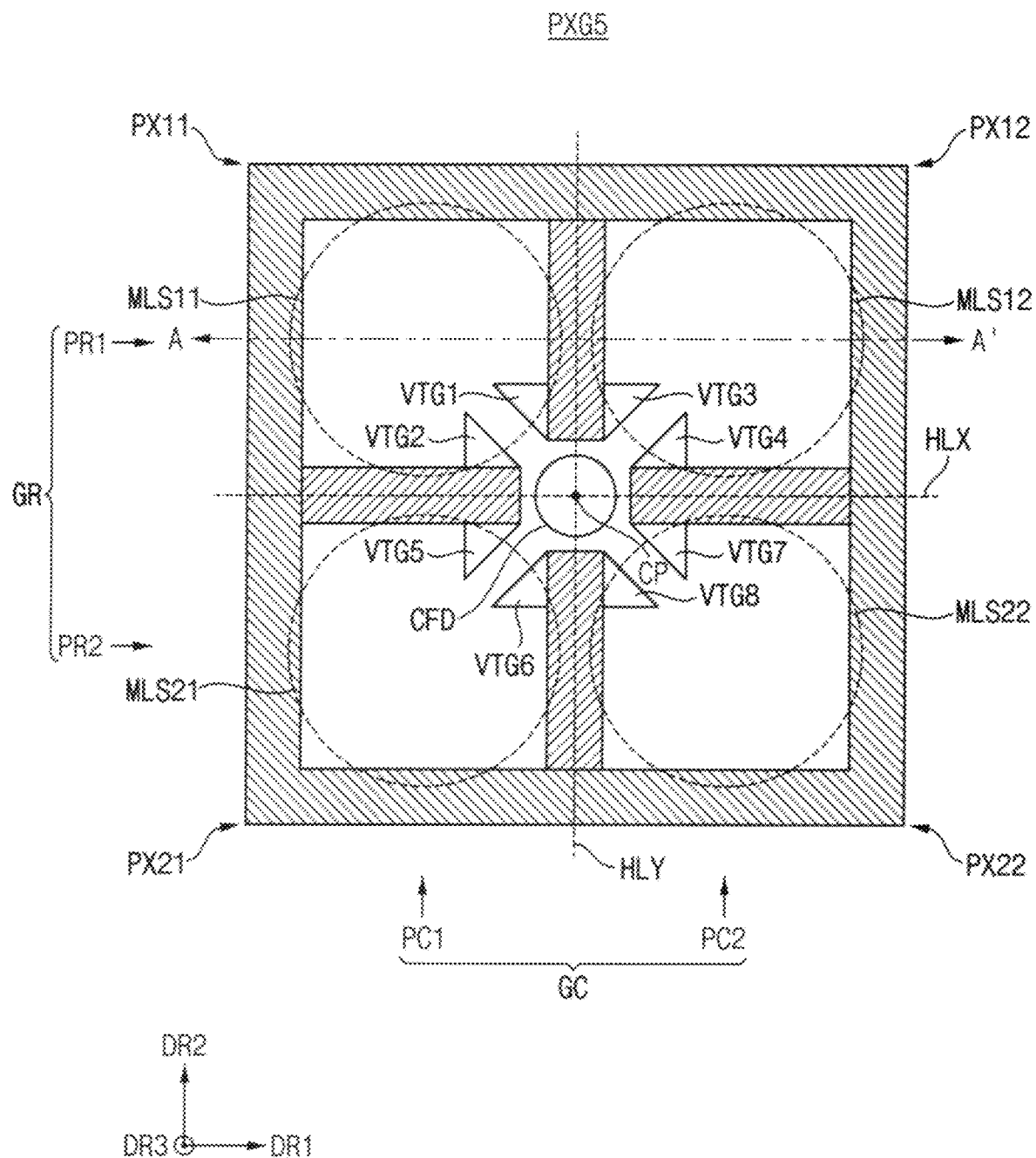
FIG. 13 is a plan view illustrating a layout of a pixel group included in an image sensor according to example embodiments.
Figure 14:
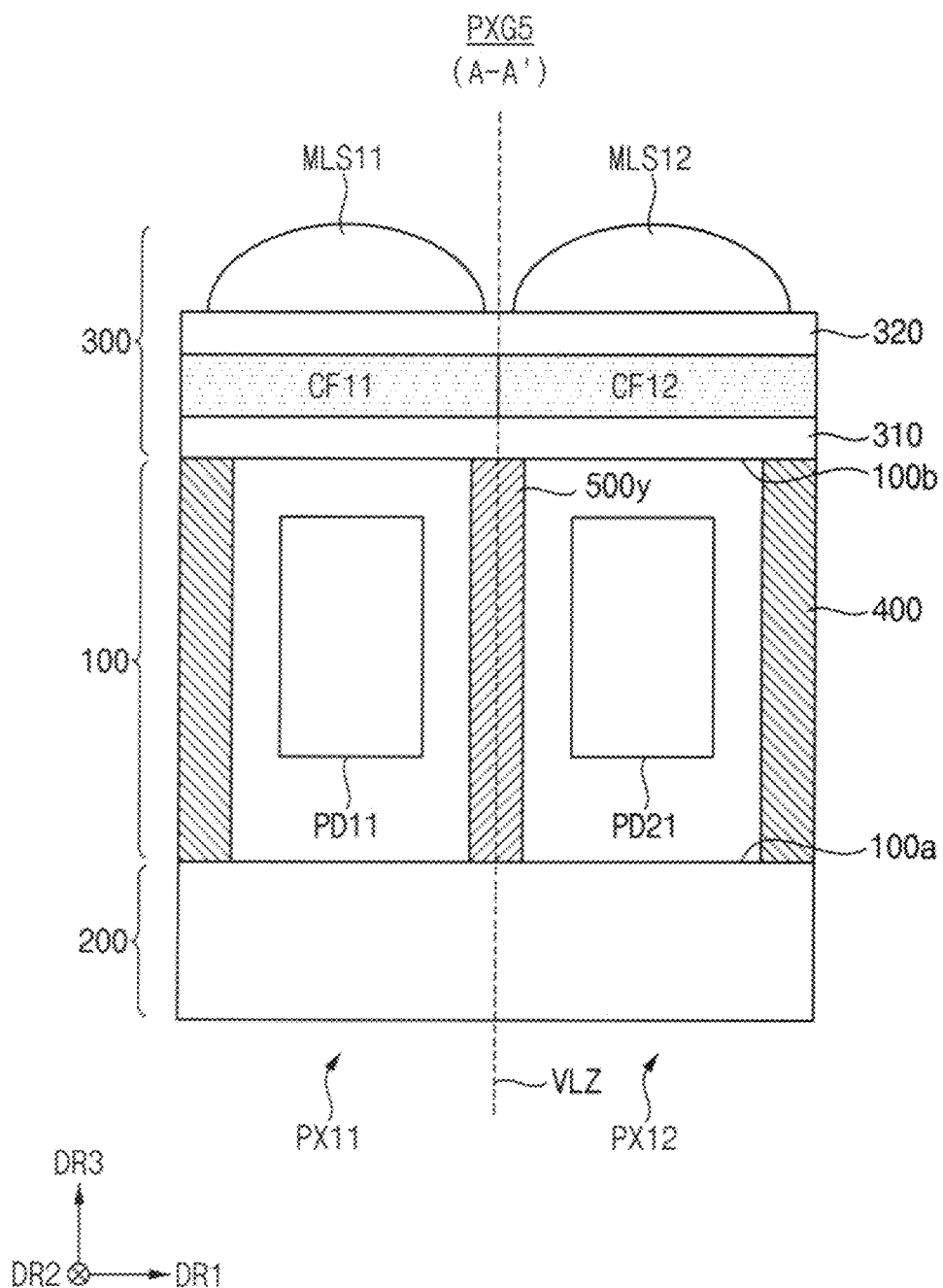
FIG. 14 is a cross-sectional view illustrating a vertical structure of a pixel group of FIG. 13.

FIG. 13 is a plan view illustrating a layout of a pixel group included in an image sensor according to example embodiments, and FIG. 14 is a cross-sectional view illustrating a vertical structure of a pixel group of FIG. 13. FIG. 14 is a cross-sectional view along the A-A' line in FIG. 13.

Referring to FIGS. 13 and 14, a pixel group PXG5 may include a semiconductor substrate 100, an interconnection layer 200 and/or an optically-transparent layer 300. In case of the BSI structure, the semiconductor substrate 100 may be disposed between the interconnection layer 200 and the optically-transparent layer 300. For example, the semiconductor substrate 100 may have an upper surface 100a and a lower surface 100b on opposite sides thereof. The interconnection layer 200 may be disposed on the upper surface 100a of the semiconductor substrate 100, and the optically-transparent layer 300 may be disposed on the second surface 100b of the semiconductor substrate 100.

The optically-transparent layer 300 may include first through fourth color filters CF11~CF22 and first through forth microlenses MLS11~MLS22 corresponding to the first through fourth unit pixels PX11~PX22. The optically-transparent layer 30 may be configured to allow external incident light to be filtered and focused on the semiconductor substrate 100. The color filters CF11~CF22 and the microlenses MLS11~MSL22 may be provided on the lower surface 100b of the semiconductor substrate 100. A first flattening layer 310 may be disposed between the lower surface of the semiconductor substrate 100 and the color filters CF11~CF22, and a second flattening layer 320 may be disposed between the color filters CF11~CF22 and the microlens MLS11~MLS22.

The color filters CF11~CF22 may include one of red, green, and blue filters. In some example embodiments, the color filters CF11~CF22 may include one of cyan, magenta, and yellow filters. When the unit pixels PX11~PX22 in the pixel group PXG correspond to the same color, the unit pixels PX11~PX22 may share the single color filter CF as illustrated in FIGS. 15 and 16.

Figure 15:
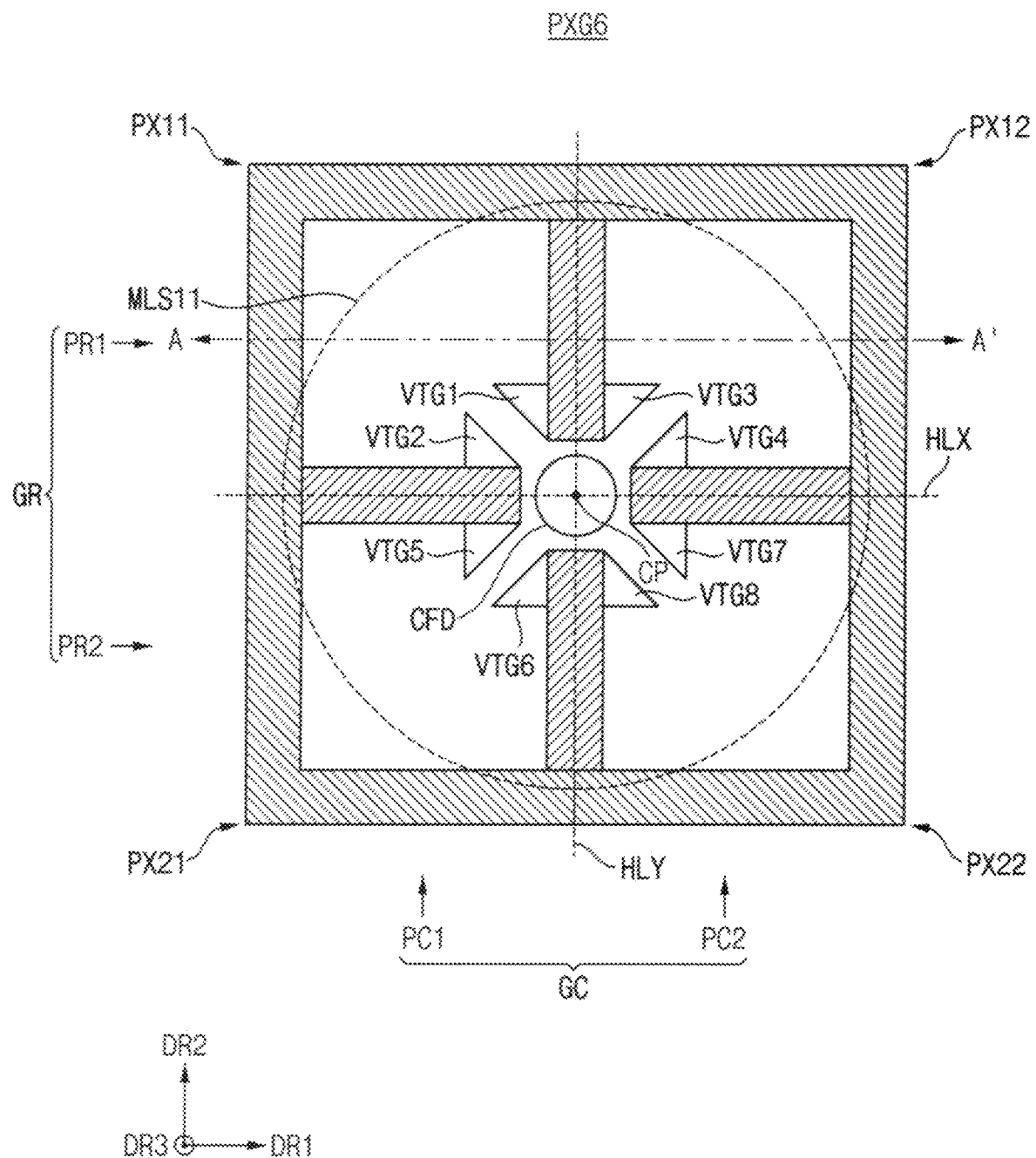
FIG. 15 is a plan view illustrating a layout of a pixel group included in an image sensor according to example embodiments.
Figure 16:
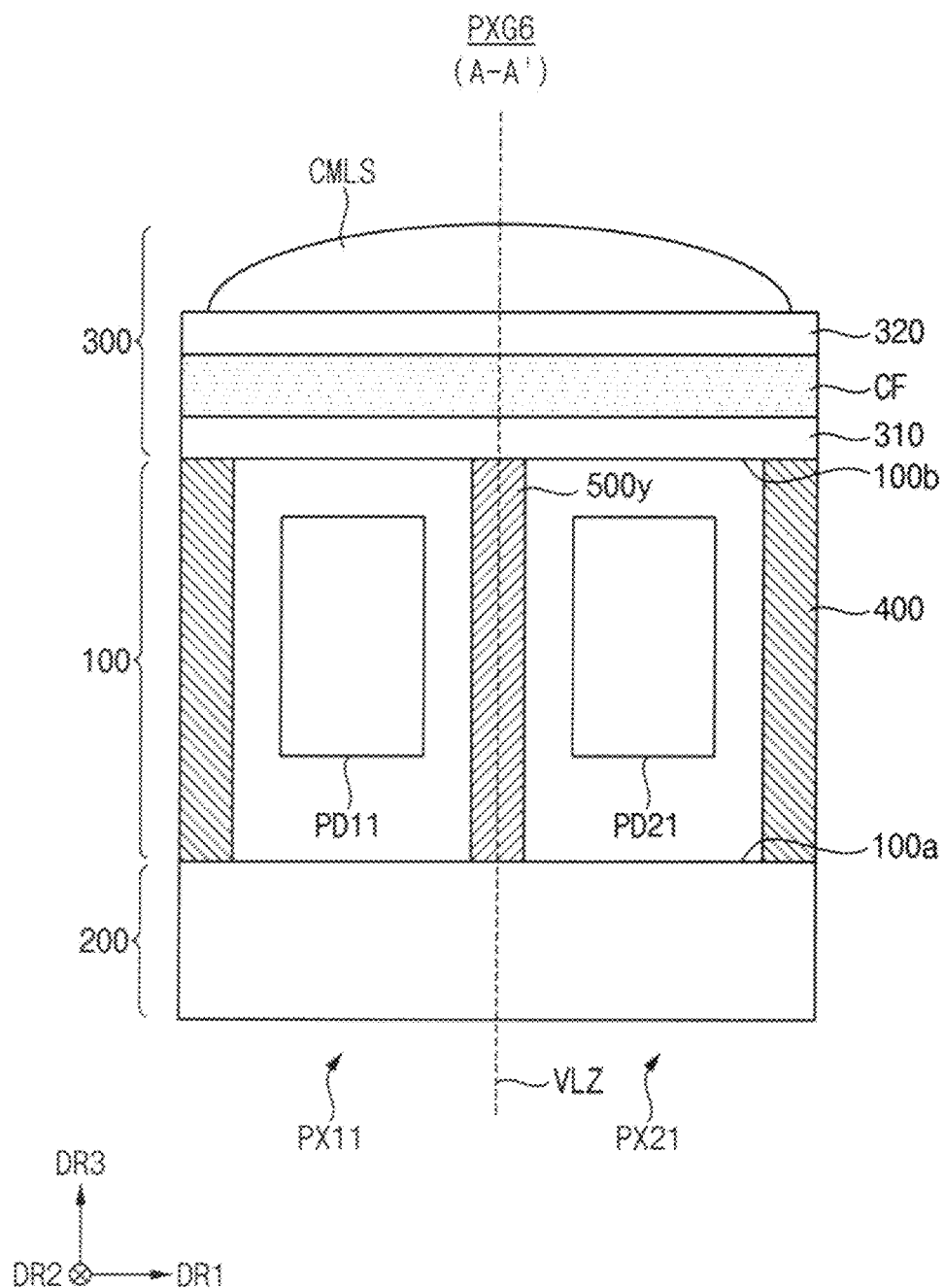
FIG. 16 is a cross-sectional view illustrating a vertical structure of a pixel group of FIG. 15.

FIG. 15 is a plan view illustrating a layout of a pixel group included in an image sensor according to example embodiments, and FIG. 16 is a cross-sectional view illustrating a vertical structure of a pixel group of FIG. 15. FIG. 16 is a cross-sectional view along the A-A' line in FIG. 15. A pixel group PXG6 of FIGS. 15 and 16 is the same or substantially the same as the pixel group PXG5 of FIGS. 13 and 14, except the microlens, and the repeated descriptions are omitted.

Referring to FIGS. 15 and 16, the first through fourth unit pixels PX11~PX22 included in the pixel group PXG6 may share a common microlens CMLS. The common microlens CMLS may be disposed above or below the semiconductor substrate. The common microlens CMLS may cover all of the first through fourth photoelectric conversion elements PD11~PD22 respectively included in the first through fourth unit pixels PX11~PX22 to focus an incident light to the first through fourth photoelectric conversion elements PD11~PD22.

The image sensor may perform auto focusing to adjust a focus of a device including the image sensor based on difference between the electrical signals from the photoelectric conversion elements PD11~PD22 that share the common microlens CMLS.

As such, the pixel array and the image sensor according to example embodiments may implement an auto focusing function and also enhance image quality by reducing crosstalk between the unit pixels using the plurality of unit pixels sharing the common microlens and trench structures extending from the upper surface of the semiconductor substrate to the lower surface of the semiconductor substrate.

Figure 17A:
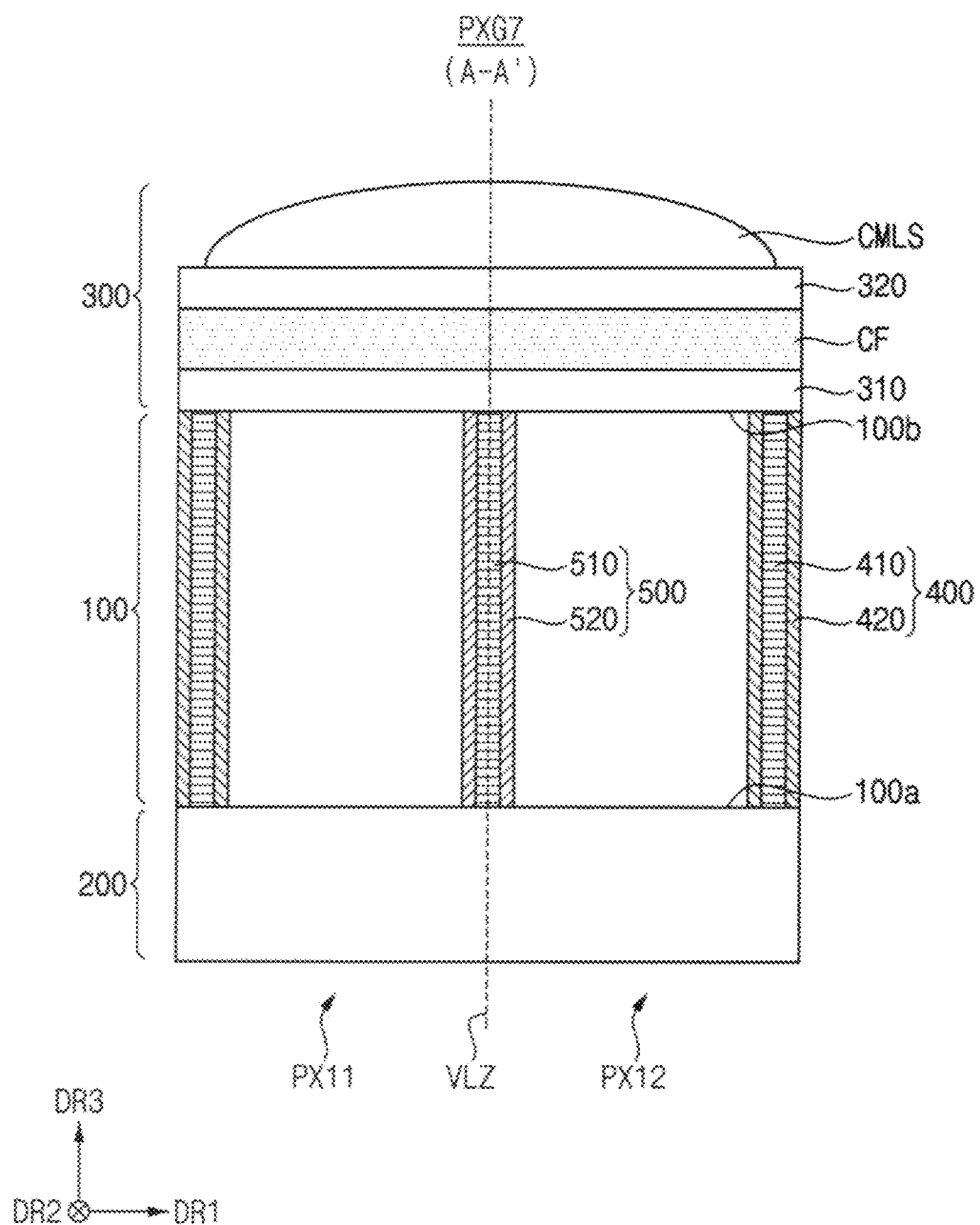
FIGS. 17A and 17B are cross-sectional views illustrating example embodiments of a trench structure of a pixel group included in an image sensor according to example embodiments.
Figure 17B:
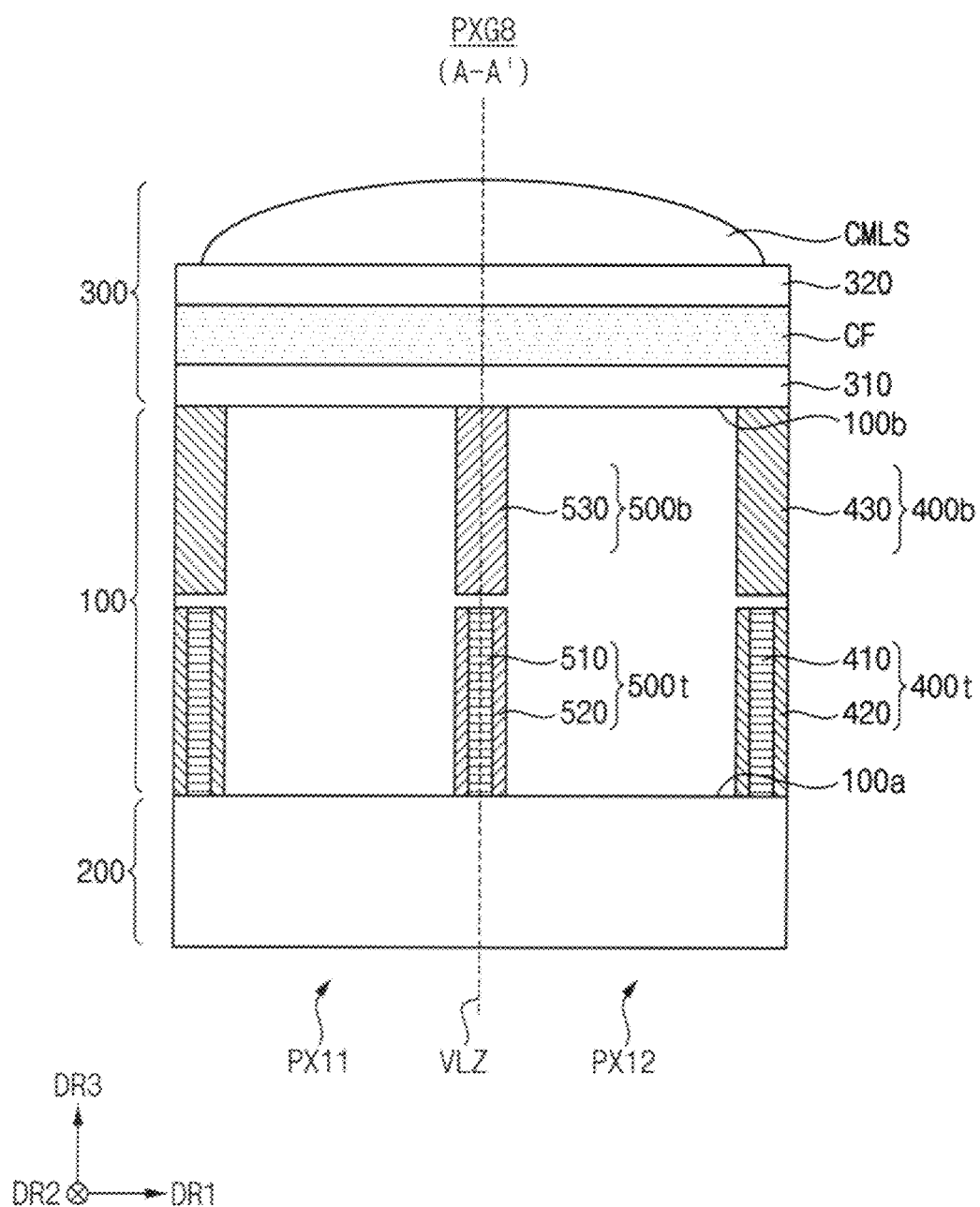

FIGS. 17A and 17B are cross-sectional views illustrating example embodiments of a trench structure of a pixel group included in an image sensor according to example embodiments. FIGS. 17A and 17B are cross-sectional views along the A-A' line in FIG. 15. The descriptions repeated with FIGS. 15 and 16 are omitted.

The trench structures 400 and 500 may be formed of an insulating material having a refractive index lower than that of the semiconductor substrate 100 (e.g., of silicon), and may include one or more insulating layers. For example, the trench structure 400 and 500 may be formed of or include at least one of a silicon oxide layer, a silicon nitride layer, an undoped poly-silicon layer, air, or combinations thereof. The formation of the trench structures 400 and 500 may include removing portions of the upper surface 100a and/or the lower surface 100b of the semiconductor substrate 100 to form a deep trench and filling the deep trench with an insulating material.

As described above, the trench structures 400 and 500 may be disposed in the semiconductor substrate 100 and extend in the vertical direction DR3 from the upper surface 100a of the semiconductor substrate 100 and to the lower surface 100b of the semiconductor substrate 100 to electrically and optically separate the photoelectric conversion elements PD11~PD22 from each other.

In some example embodiments, as a pixel group PXG7 illustrated in FIG. 17A, each of the trench structures 400 and 500 may include a trench such that inner surfaces of the trench is coated with a transparent dielectric material 410 and 510 and an inner space of the trench is filled with a material 420 and 520 different from the transparent dielectric material 410 and 510. For example, the transparent dielectric material 410 and 510 may be an oxide and the material 420 and 520 may be a nitride. In other words, the trench structures 400 and 500 may have ONO (oxide-nitride-oxide) structure in the horizontal directions DR1 and DR2. In some example embodiments, each of the trench structures 400 and 500 may include a trench such that the trench is filled with the transparent dielectric material 410 and 510.

In some example embodiments, as a pixel group PXG8 illustrated in FIG. 17B, each of the trench structures 400 and 500 may include an upper trench structure 400t and 500t formed by a front trench process from the upper surface 100a of the semiconductor substrate 100, and a lower trench structure 400b and 500b formed by a back trench process from the lower surface 100b of the semiconductor substrate 100.

In some example embodiments, the upper trench structure 400t and 500t has a structure or a composition different from the lower trench structure 400b and 500b. For example, as a pixel group PXG3 illustrated in FIG. 3B, the upper trench structure 400t and 500t may include a trench such that inner surfaces of the trench is coated with a transparent dielectric material 410 and 510 and an inner space of the trench is filled with a material 420 and 520 different from the transparent dielectric material 410 and 510, whereas the lower trench structure 400b and 500b include a trench such that the trench is filled with a transparent dielectric material 430 and 530.

Figure 18:
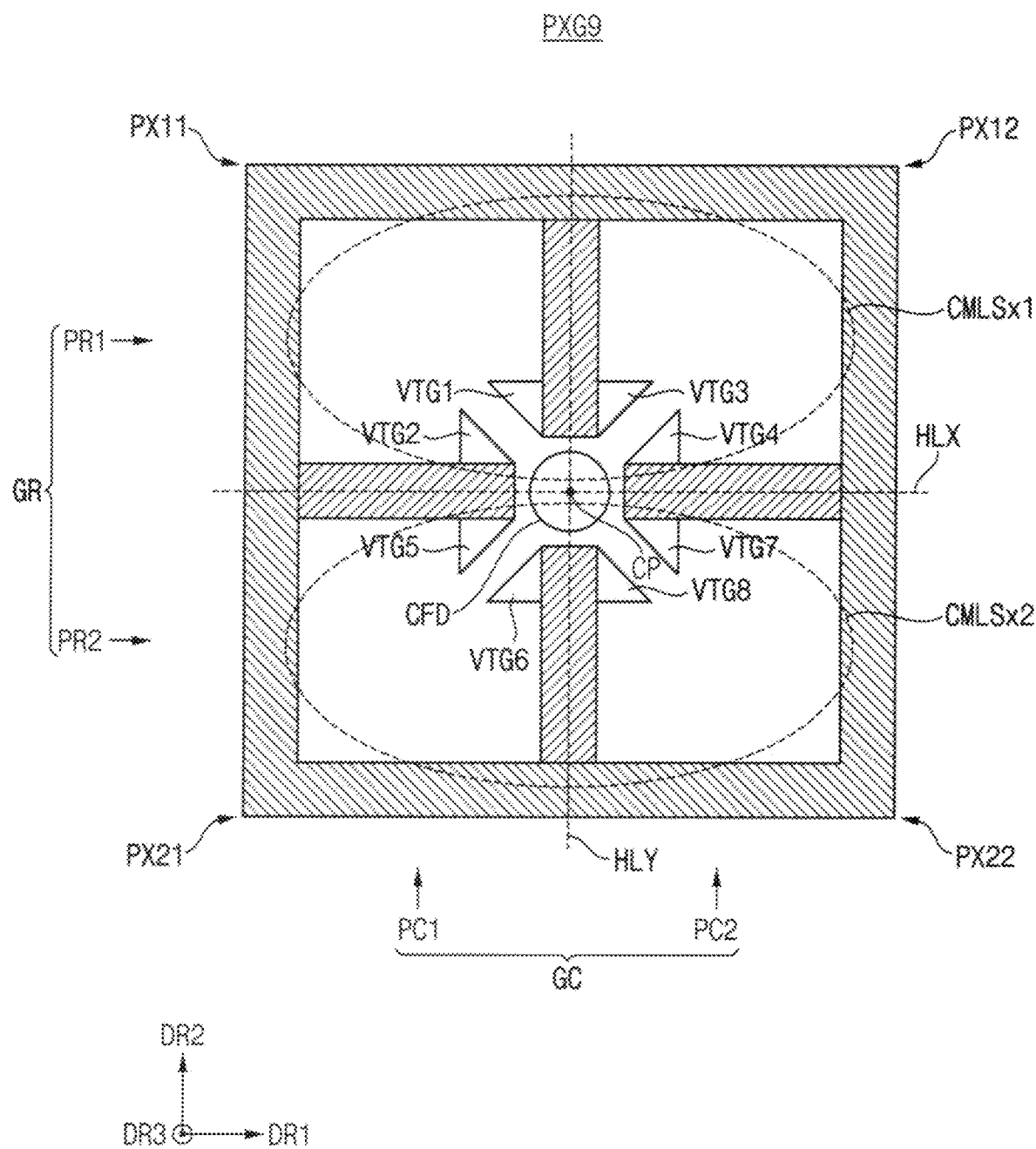
FIGS. 18 and 19 are plan views illustrating a layout of a pixel group included in an image sensor according to example embodiments.
Figure 19:
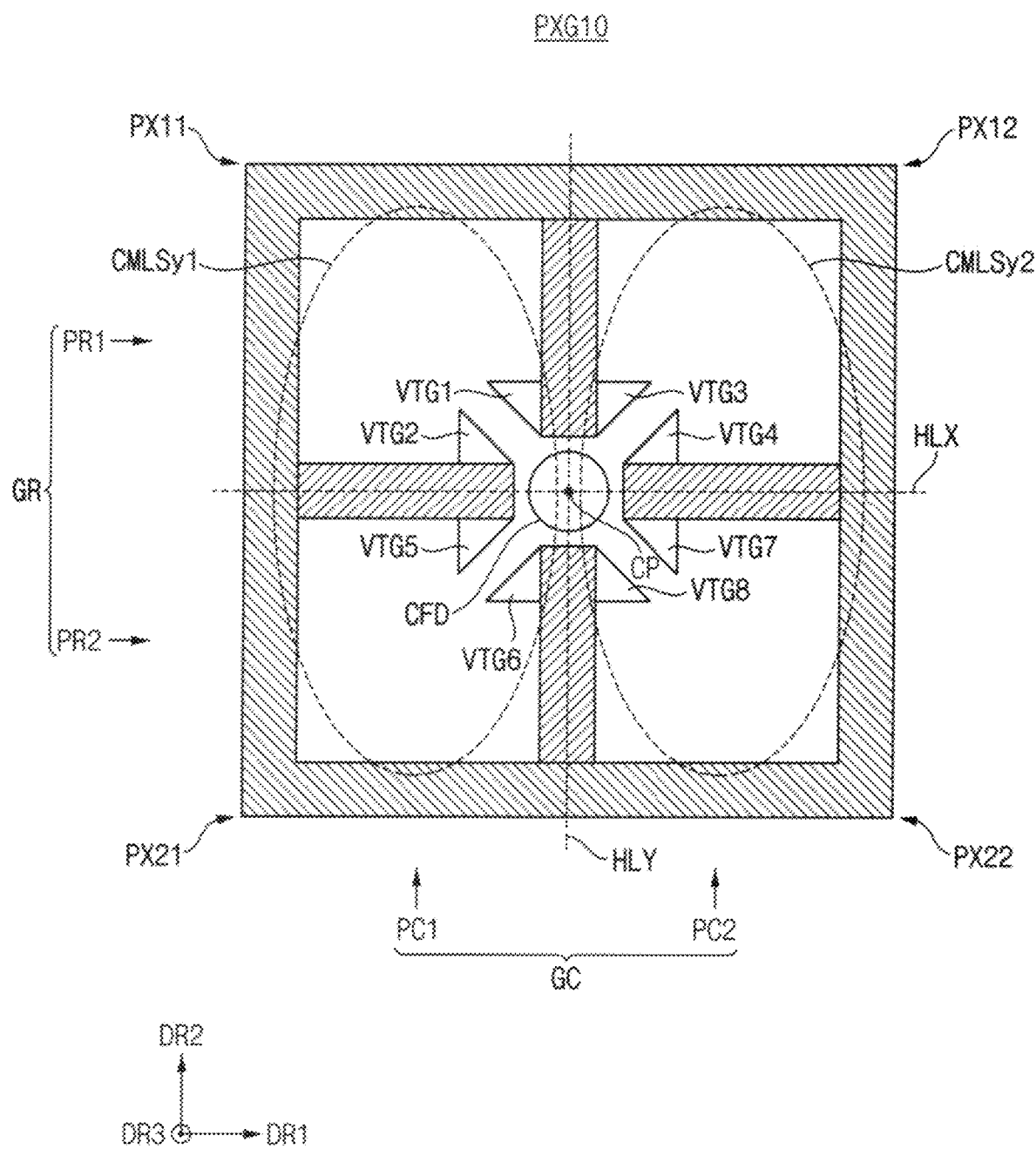

FIGS. 18 and 19 are plan views illustrating a layout of a pixel group included in an image sensor according to example embodiments. Pixel groups PXG9 and PXG10 of FIGS. 18 and 19 are the same or substantially the same as the pixel group PXG6 of FIGS. 15 and 16, except the microlens, and the repeated descriptions are omitted.

Referring to FIGS. 18 and 19, each of pixel groups PXG9 and PXG10 may include two common microlens of an ellipse shape disposed above or below the semiconductor substrate 100. Each of the two common microlens of the ellipse shape may cover two of first through fourth photoelectric conversion elements PD11~PD22 respectively included in the first through fourth unit pixels PX11~PX22 to focus an incident light to the two of the first through fourth photoelectric conversion elements PD11~PD22.

In some example embodiments, as illustrated in FIG. 18, the pixel group PXG9 may include first and second common microlenses CMLSx1 and CLMLSx2 of an ellipse shape having a major axis in the first horizontal direction DR1. In some example embodiments, the first common microlens CMLSx1 may be shared by the first and second unit pixels PX11 and PX12 that are adjacent in the first horizontal direction DR1, and the second common microlens CMLSx2 may be shared by the third and fourth unit pixels PX21 and PX22 that are adjacent in the first horizontal direction DR1.

In some example embodiments, as illustrated in FIG. 19, the pixel group PXG10 may include first and second common microlenses CMLSy1 and CLMLSy2 of an ellipse shape having a major axis in the second horizontal direction DR2. In some example embodiments, the first common microlens CMLSy1 may be shared by the first and third unit pixels PX11 and PX21 that are adjacent in the second horizontal direction DR2, and the second common microlens CMLSy2 may be shared by the second and fourth unit pixels PX12 and PX22 that are adjacent in the second horizontal direction DR2.

Figure 20:
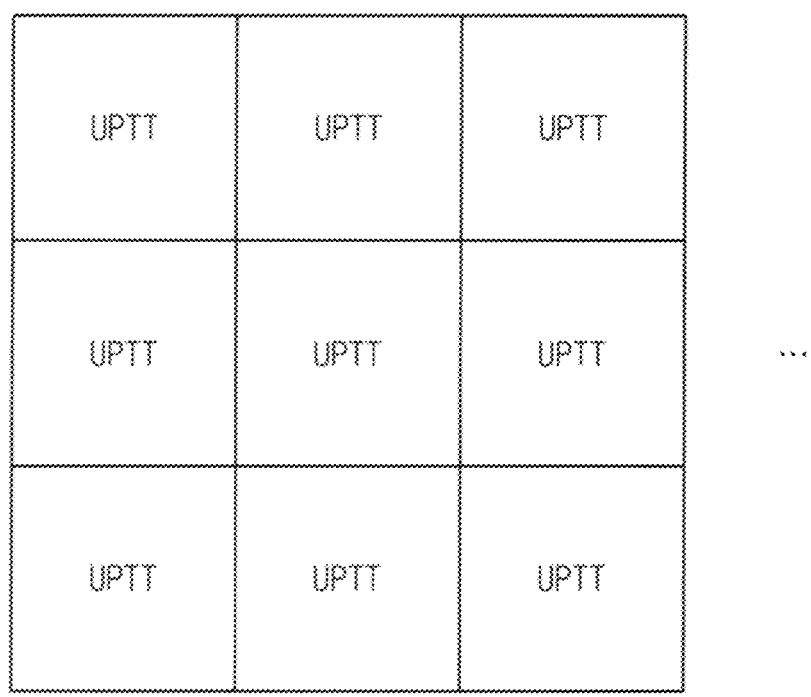
FIG. 20 is a diagram illustrating a layout of a pixel array according to example embodiments.
Figure 20:
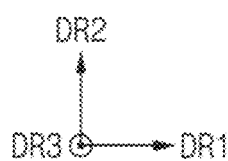

FIG. 20 is a diagram illustrating a layout of a pixel array according to example embodiments.

Referring to FIG. 20, the pixel array 620 in the image sensor 600 of FIG. 6 may be divided into unit patterns UPTT that are arranged repeatedly in the first horizontal direction DR1 and the second horizontal direction DR2. Each unit pattern UPTT may include two or more pixel group where each pixel group include a plurality of unit pixels sharing a common microlens CMLS as described above.

In some example embodiments, all of the unit patterns UPTT in the pixel array 620 may be identical. In some example embodiments, the unit pattern UPTT is a minimum pattern that cannot be divided into smaller patterns. In some example embodiments, the unit patterns UPTT in the pixel array 620 may include two or more different patterns such that the different patterns are arranged regularly in the first horizontal direction DR1 and/or the second horizontal direction DR2.

Hereinafter, various color filter array and unit patterns according to example embodiments are described with reference to FIGS. 21A through 25C. The unit pattern may be inverted in the first horizontal direction DR1 and/or the second horizontal direction DR2, or the unit pattern may be rotated around the vertical direction by 90 degrees or 180 degrees.

In FIGS. 21A through 25C, a unit pixel corresponding to a red filter is referred to as a red pixel R, a unit pixel corresponding to a green filter is referred to as a green pixel G, a unit pixel corresponding to a blue filter is referred to as a blue pixel B, a unit pixel corresponding to a yellow filter is referred to as a yellow pixel Y, and a unit pixel corresponding to a cyan filter is referred to as a cyan pixel C. For a pixel group PXGij, i indicates an index of a corresponding group row, and j indicates an index of a corresponding group column. When the unit pixels in each pixel group correspond to the same color, the unit pixels in each pixel group may share a single color filter CF.

FIGS. 21A through 22B are plan views illustrating example embodiments of a unit pattern of a 4*4 size included in a pixel array according to example embodiments.

Referring to FIGS. 21A through 22B, each of unit patterns UPTT1~UPTT7 having a 4*4 size may include first through fourth pixel groups PGX11~PGX22 arranged in a matrix form of two group rows GR1 and GR2 and two group columns GC1 and GC2. Each of the first through fourth pixel groups PGX11~PGX22 may include four unit pixels arranged in a matrix form of two pixel rows and two pixel columns.

Figure 21A:
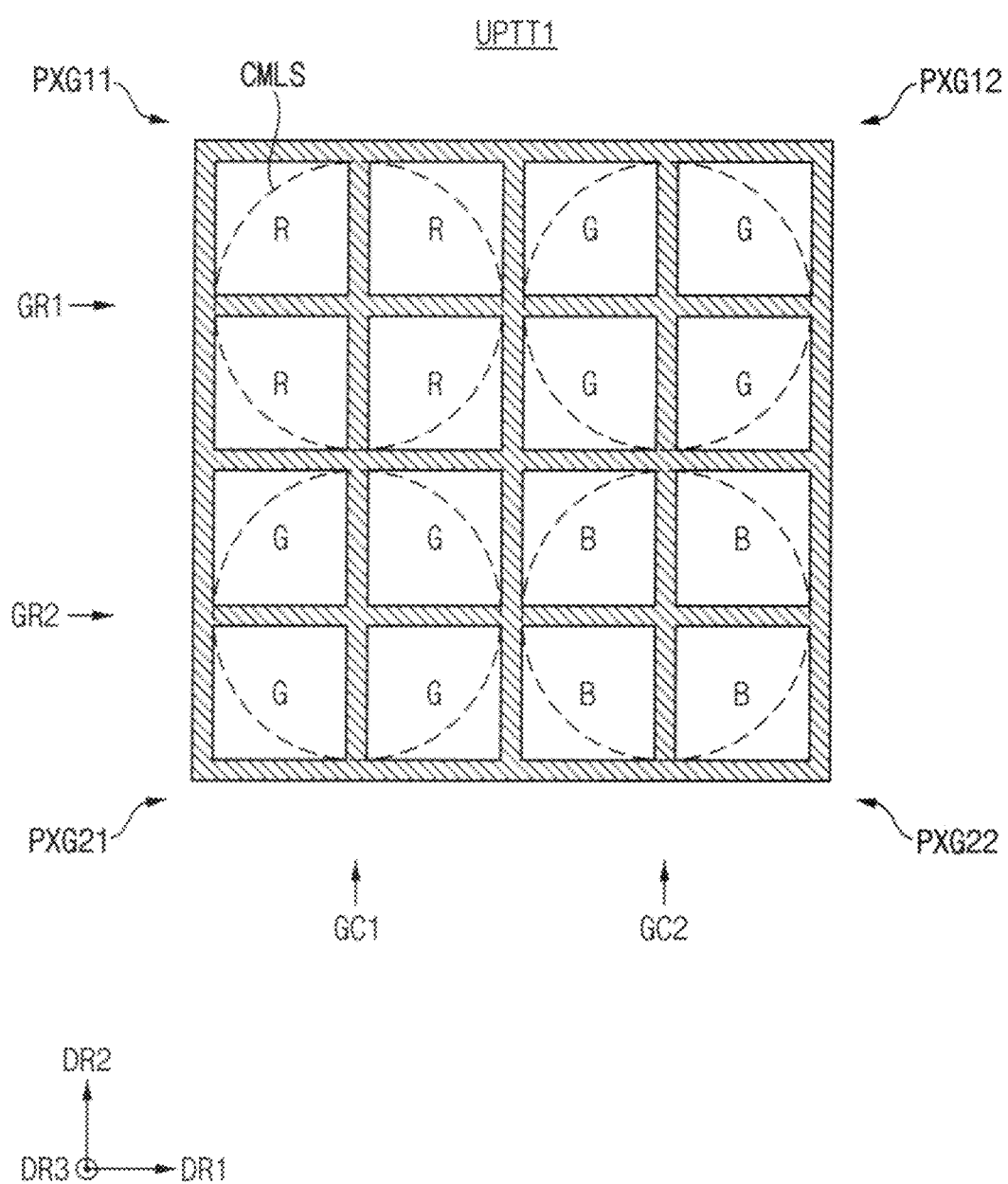
FIGS. 21A through 22B are plan views illustrating example embodiments of a unit pattern of a 4*4 size included in a pixel array according to example embodiments.

In some example embodiments, as the unit pattern UPTT1 illustrated in FIG. 21A, the first pixel group PXG11 may include four red pixels R, each of the second and third pixel groups PXG12 and PXG21 may include four green pixels G, and the fourth pixel group PXG22 may include four blue pixels B.

Figure 21B:
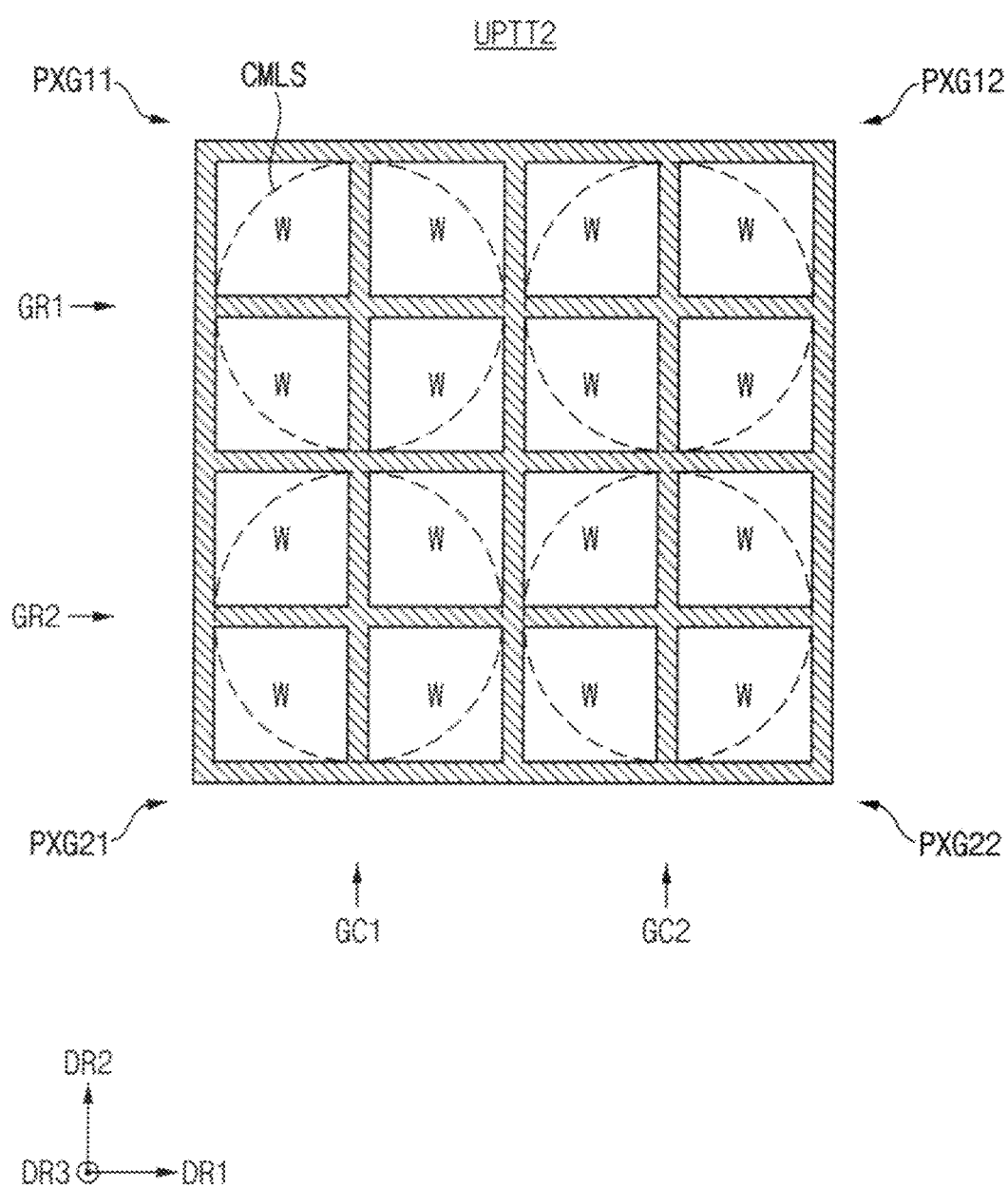

In some example embodiments, as the unit pattern UPTT2 illustrated in FIG. 21B, each of the first through fourth pixel groups PXG11~PXG22 may include four white pixels W.

Figure 21C:
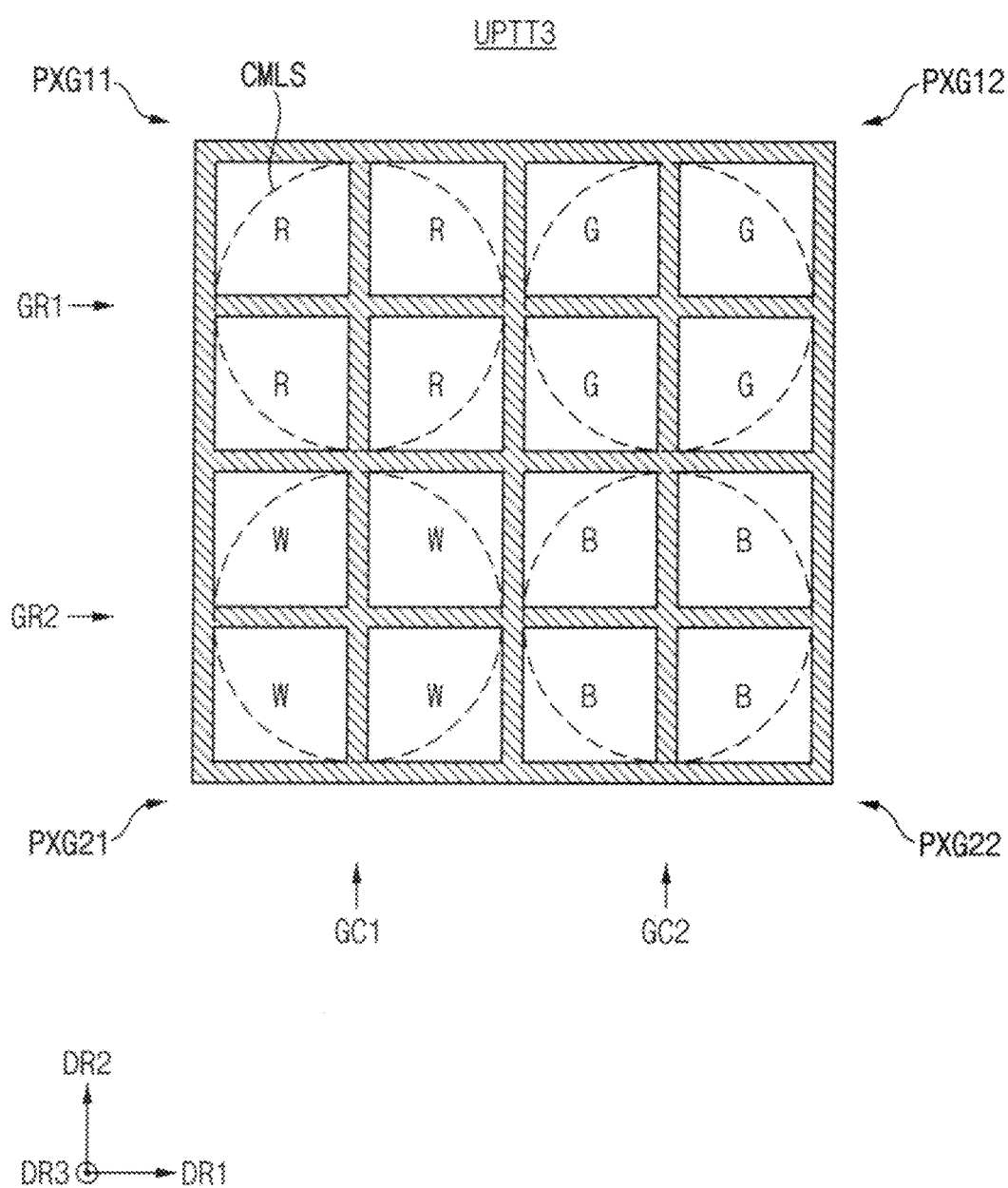

In some example embodiments, as the unit pattern UPTT3 illustrated in FIG. 21C, the first pixel group PXG11 may include four red pixels R, the second pixel group PXG12 may include four green pixels G, the third pixel group PXG21 may include four white pixels W, and the fourth pixel group PXG22 may include four blue pixels B.

Figure 21D:
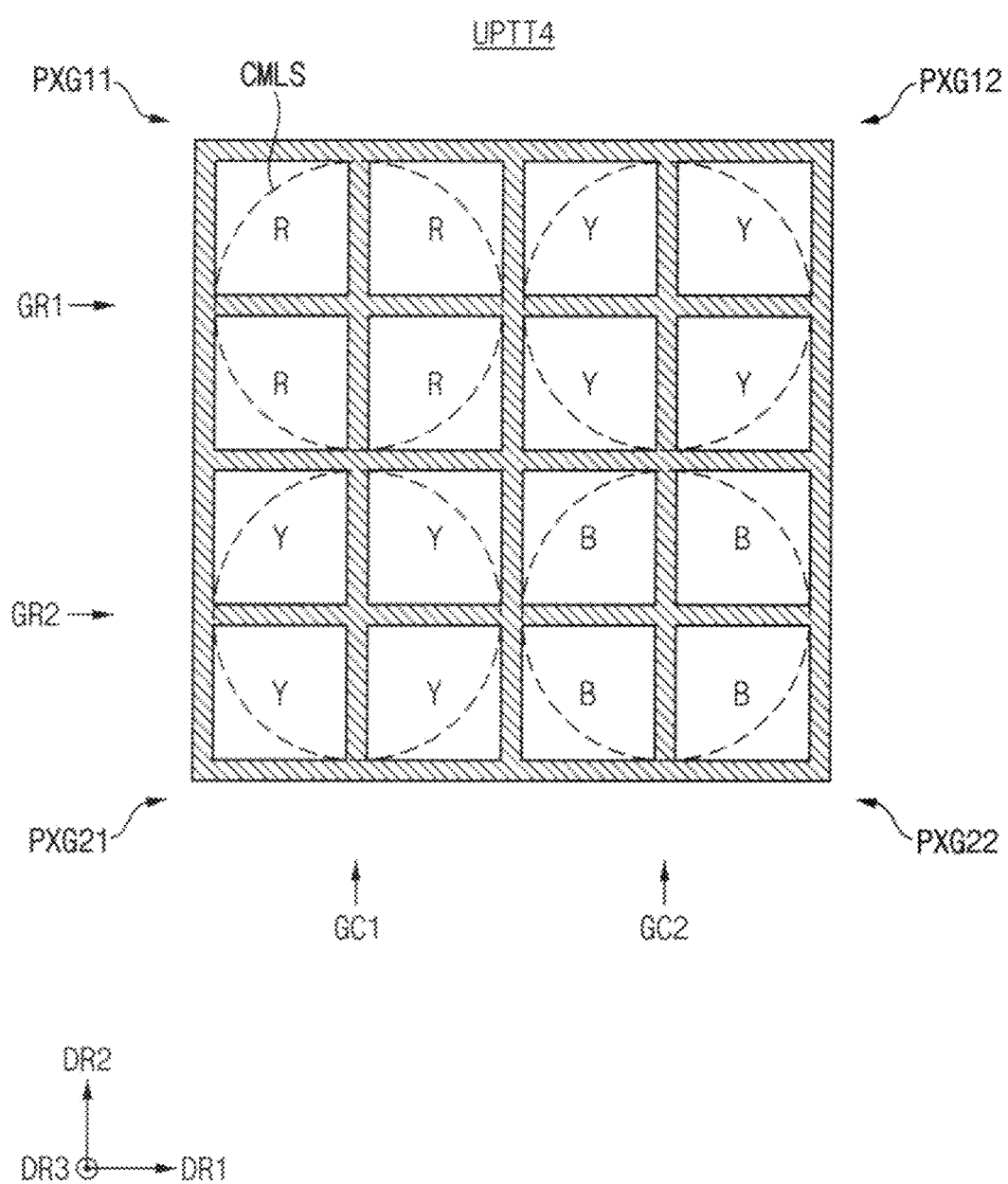

In some example embodiments, as the unit pattern UPTT4 illustrated in FIG. 21D, the first pixel group PXG11 may include four red pixels R, each of the second and third pixel groups PXG12 and PXG21 may include four yellow pixels Y, and the fourth pixel group PXG22 may include four blue pixels B.

Figure 21E:
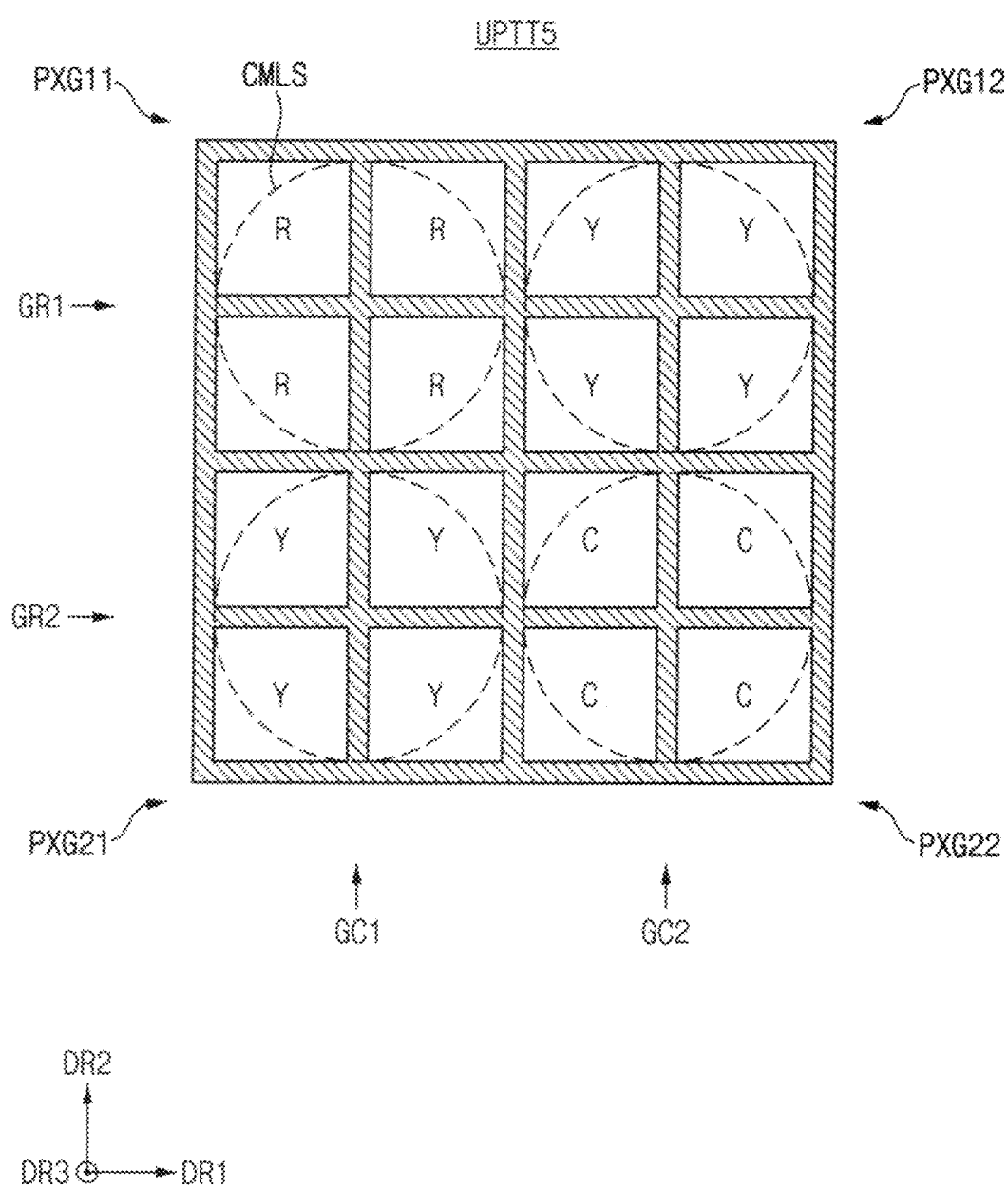

In some example embodiments, as the unit pattern UPTT51 illustrated in FIG. 21E, the first pixel group PXG11 may include four red pixels R, each of the second and third pixel groups PXG12 and PXG21 may include four yellow pixels Y, and the fourth pixel group PXG22 may include four cyan pixels C.

Figure 22A:
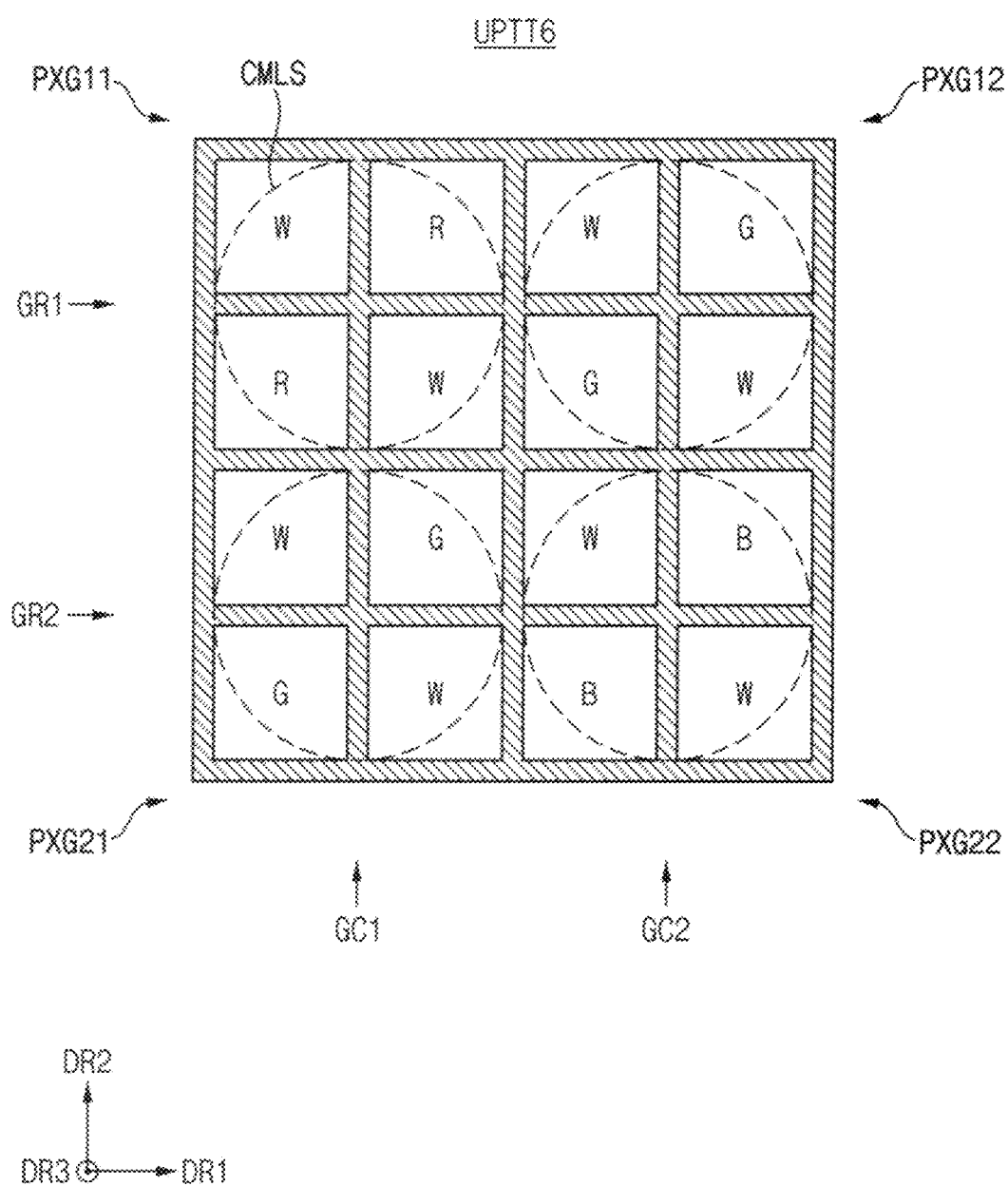

In some example embodiments, as the unit pattern UPTT6 illustrated in FIG. 22A, the first pixel group PXG11 may include two red pixels R and two white pixels W, each of the second and third pixel groups PXG12 and PXG21 may include two green pixels G and two white pixels W, and the fourth pixel group PXG22 may include two blue pixels B and two white pixels W.

Figure 22B:
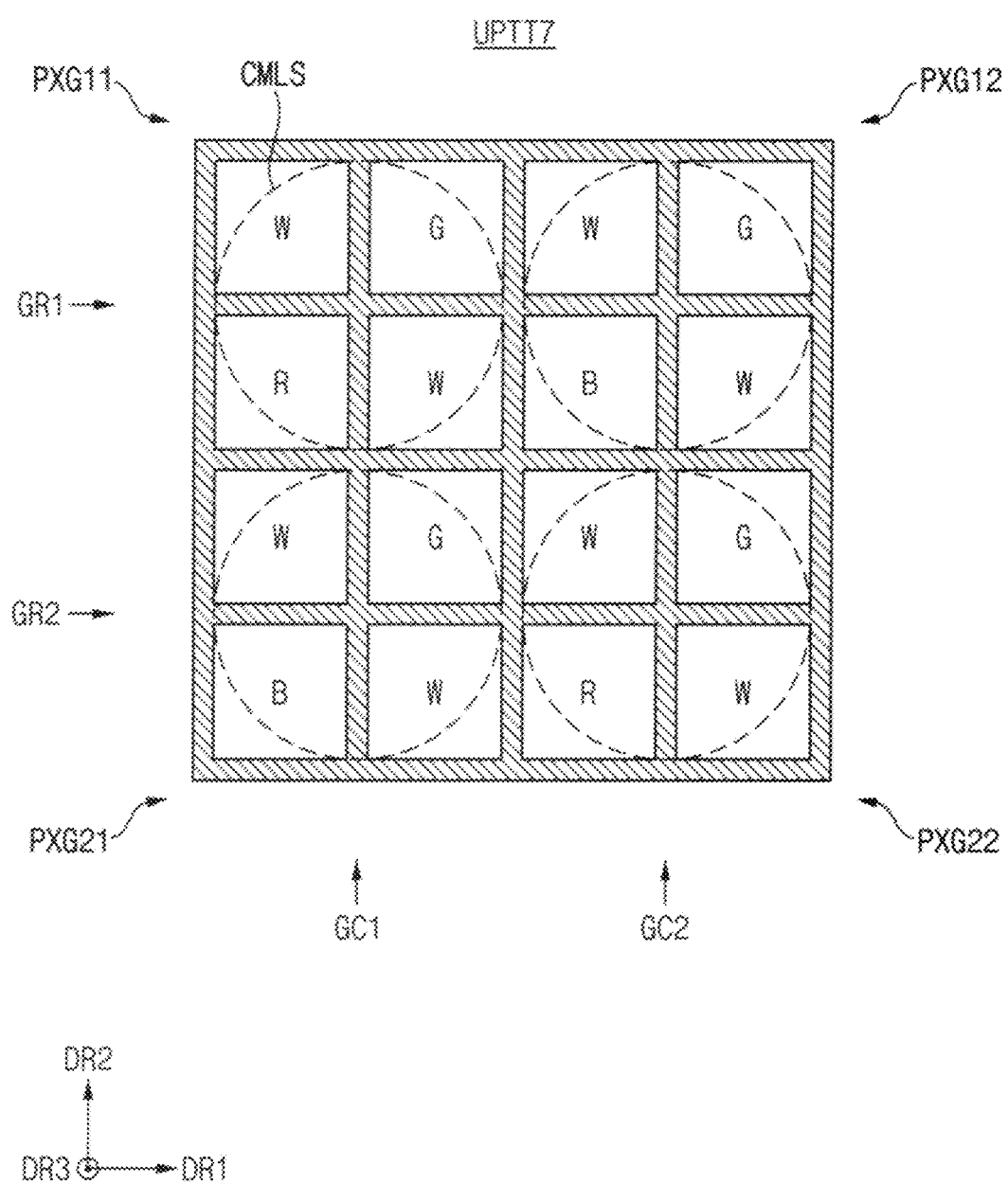

In some example embodiments, as the unit pattern UPTT7 illustrated in FIG. 22B, each of the first and fourth pixel groups PXG11 and PXG22 may include two white pixels W, one green pixel G and one red pixel R, each of the second and third pixel groups PXG12 and PXG21 may include two white pixels W, one green pixel G and one blue pixel B.

Figure 23A:
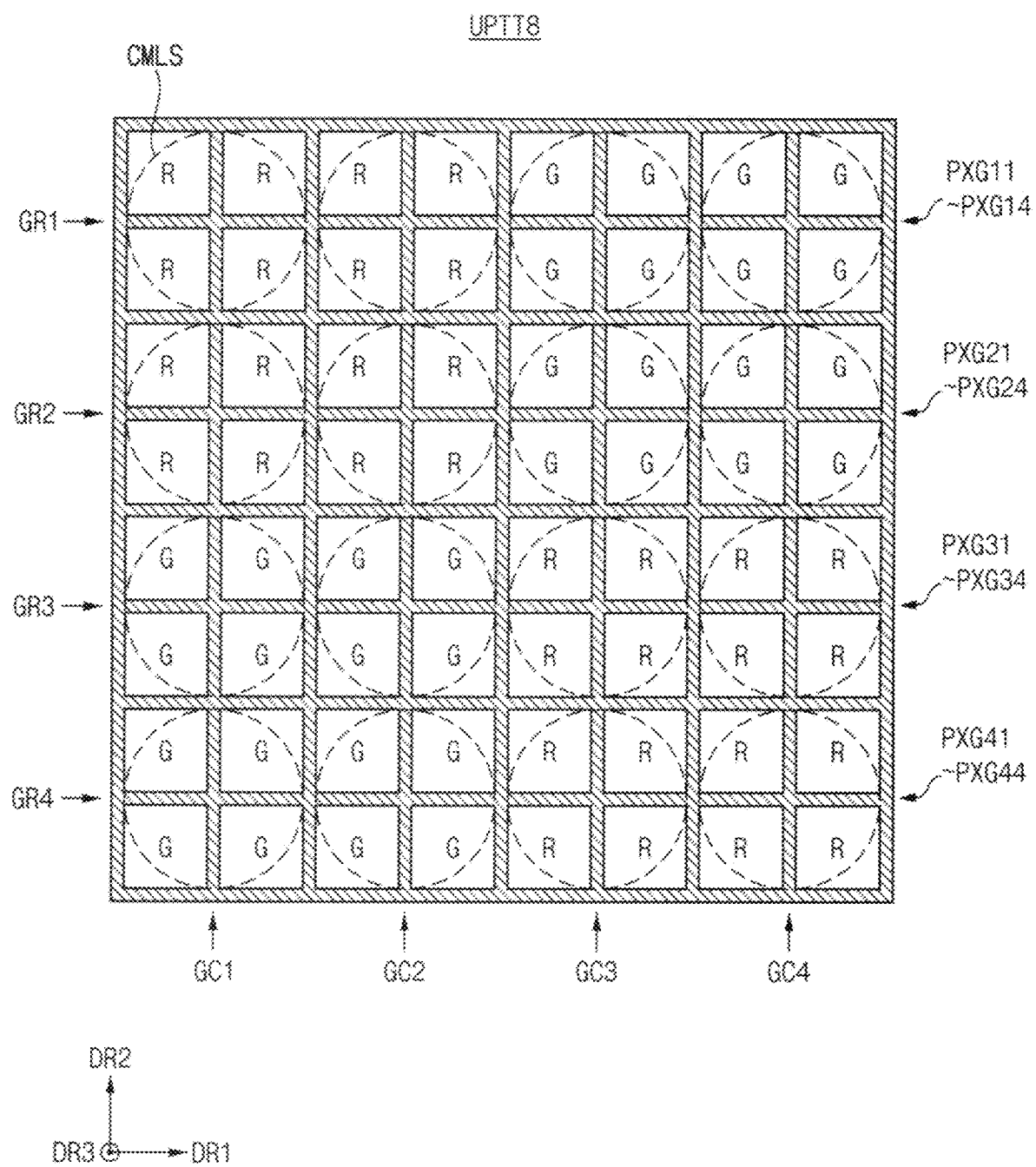
FIGS. 23A through 23C are plan views illustrating example embodiments of a unit pattern of a 8*8 size included in a pixel array according to example embodiments.
Figure 23B:
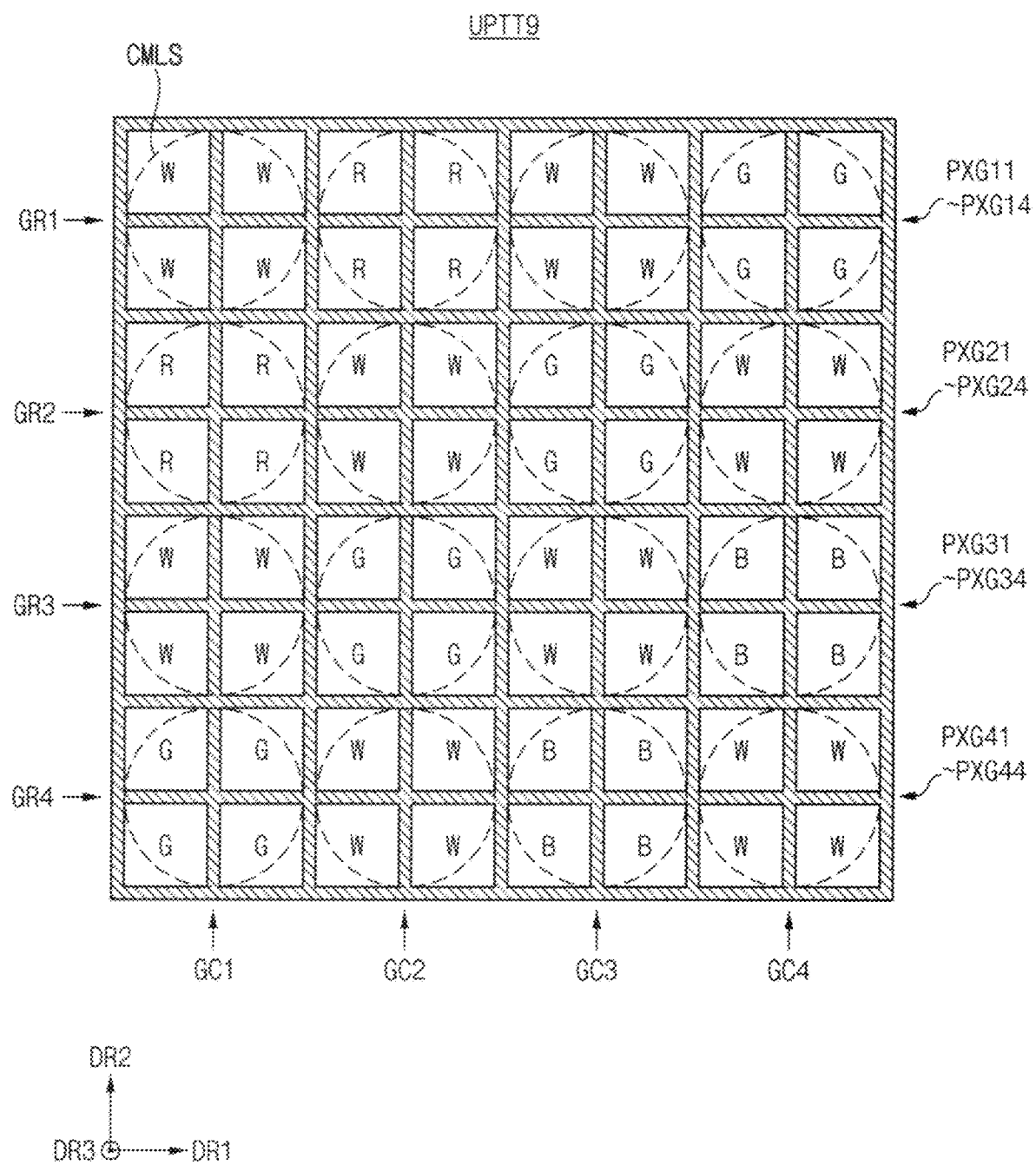
Figure 23C:
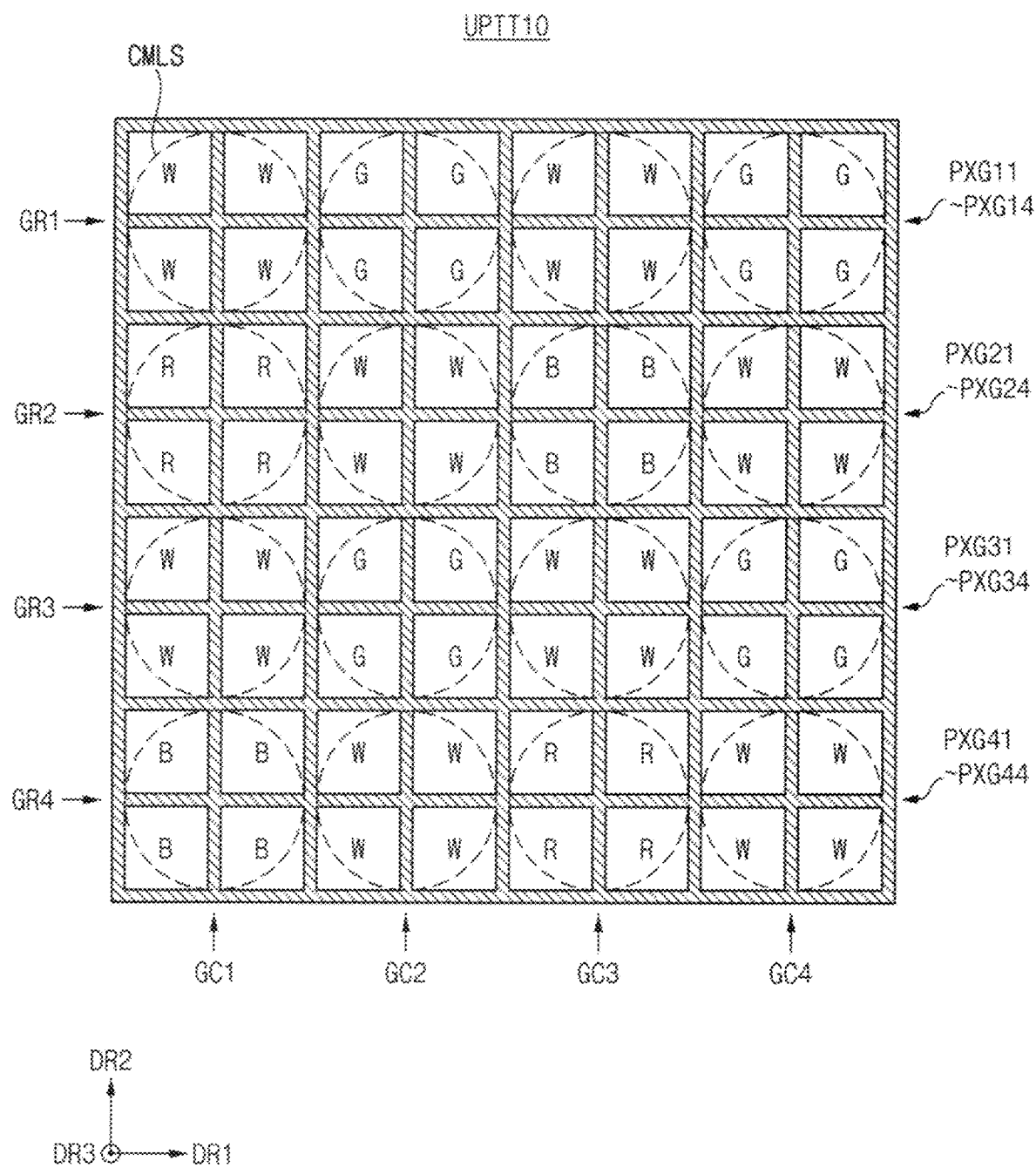

FIGS. 23A through 23C are plan views illustrating example embodiments of a unit pattern of a 8*8 size included in a pixel array according to example embodiments.

Referring to FIGS. 23A through 23C, each of unit patterns UPTT8~UPTT10 having a 8*8 size may include first through sixteenth pixel groups PGX11~PGX44 arranged in a matrix form of first through fourth group rows GR1~GR4 and first through fourth group columns GC1~GC4. The first through fourth pixel groups PXG11, PX12, PX21 and PX22 may be arranged in a matrix form of the first and second group rows GR1 and GR2 and the first and second group columns GC1 and GC2. The fifth through eighth pixel groups PXG13, PX14, PX23 and PX24 may be arranged in a matrix form of the first and second group rows GR1 and GR2 and the third and fourth group columns GC3 and GC4. The ninth through twelfth pixel groups PXG31, PX32, PX41 and PX42 may be arranged in a matrix form of the third and fourth group rows GR3 and GR4 and the first and second group columns GC1 and GC2. The thirteenth through sixteenth pixel groups PXG33, PX34, PX43 and PX44 may be arranged in a matrix form of the third and fourth group rows GR3 and GR4 and the third and fourth group columns GC3 and GC4. Each of the first through sixteenth pixel groups PGX11~PGX44 may include four unit pixels arranged in a matrix form of two pixel rows and two pixel columns.

In some example embodiments, as the unit pattern UPTT8 illustrated in FIG. 23A, each of the first through fourth pixel groups PXG11, PX12, PX21 and PX22 may include four red pixels R, each of the fifth through twelfth pixel groups PXG13, PX14, PX23, PX24, PXG31, PX32, PX41 and PX42 may include four green pixels G, and each of the thirteenth through sixteenth pixel groups PXG33, PX34, PX43 and PX44 may include four blue pixels B.

In some example embodiments, as the unit pattern UPTT9 illustrated in FIG. 23B, each of the first, fourth, fifth, eighth, ninth, twelfth, thirteenth and sixteenth pixel groups PXG11, PXG22, PXG13, PXG24, PXG31, PXG42, PXG33 and PXG44 may include four white pixels W, each of the second and third pixel groups PXG12 and PXG21 may include four red pixels R, each of the sixth, seventh, tenth and eleventh pixel groups PXG14, PXG23, PXG32 and PXG41 may include four green pixels G, and each of the thirteenth and fifteenth pixel groups PXG34 and PXG43 may include four blue pixels B.

In some example embodiments, as the unit pattern UPTT10 illustrated in FIG. 23C, each of the first, fourth, fifth, eighth, ninth, twelfth, thirteenth and sixteenth pixel groups PXG11, PXG22, PXG13, PXG24, PXG31, PXG42, PXG33 and PXG44 may include four white pixels W, each of the third and fifteenth pixel groups PXG21 and PXG43 may include four red pixels R, each of the second, sixth, tenth and fourteenth pixel groups PXG12, PXG14, PXG32 and PXG34 may include four green pixels G, and each of the seventh and eleventh pixel groups PXG23 and PX41 may include four blue pixels B.

Figure 24A:
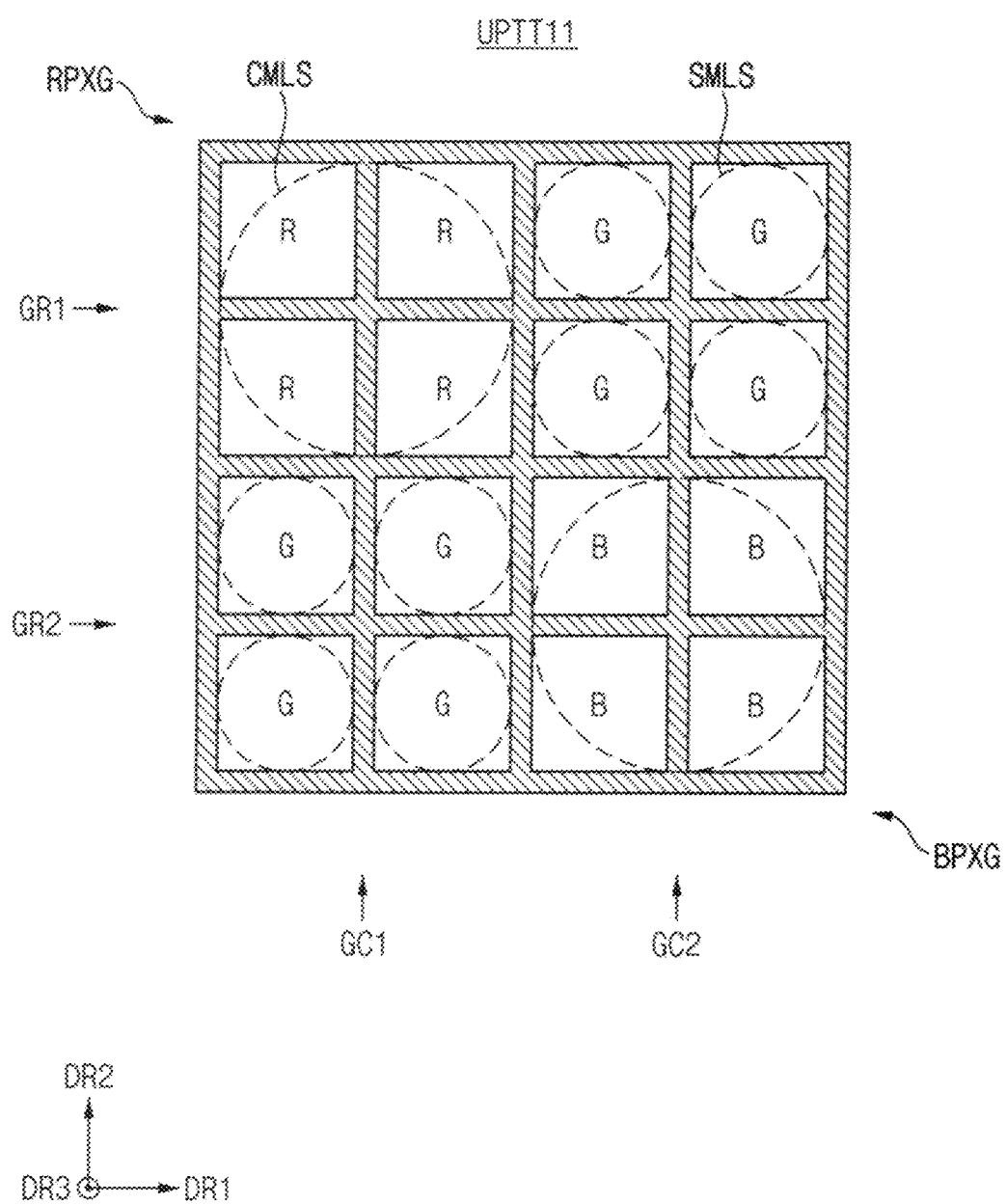
FIGS. 24A through 25C are plan views illustrating example embodiments of a unit pattern including pixel groups and unit pixels included in a pixel array according to example embodiments.
Figure 25A:
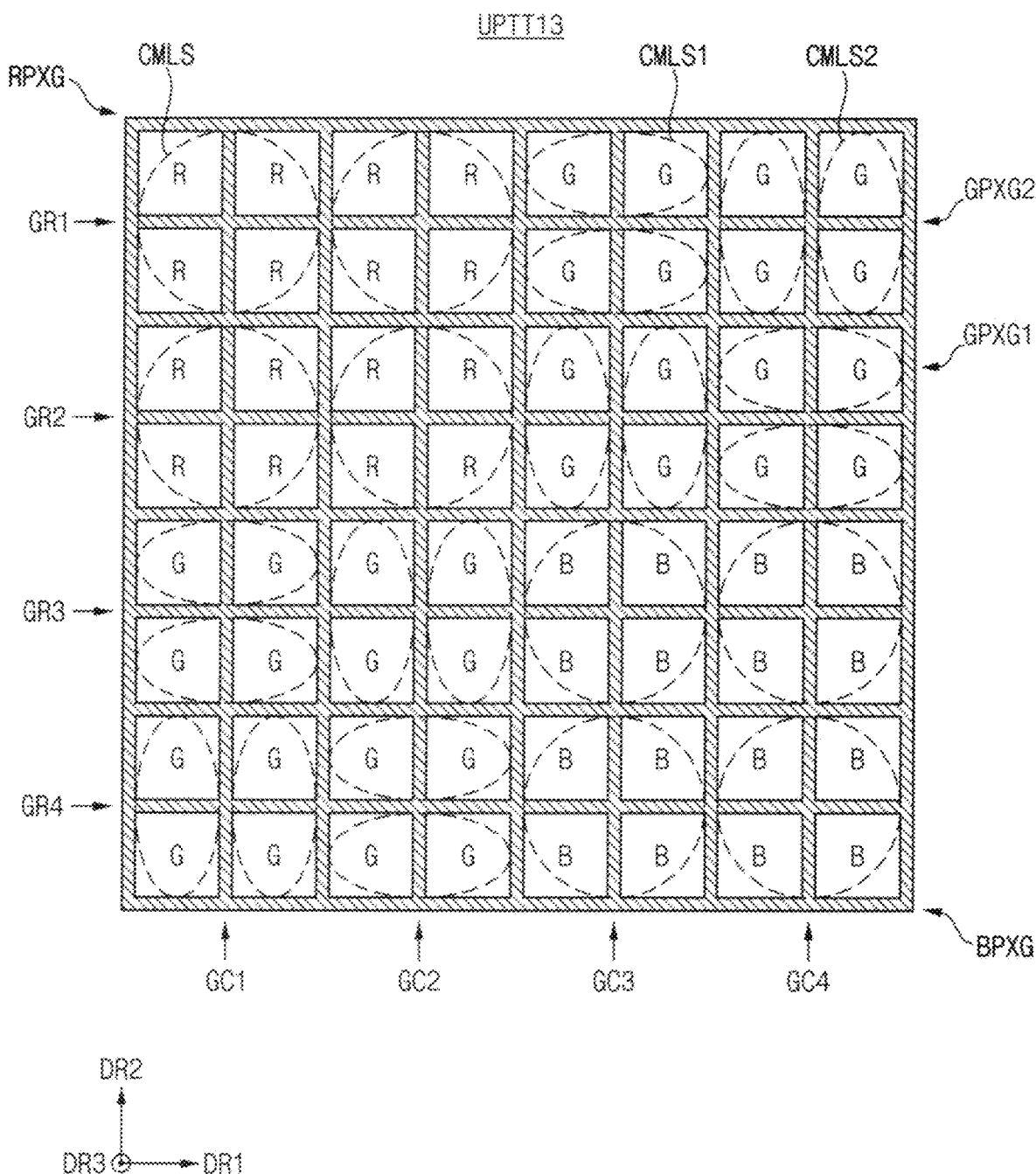
Figure 25B:
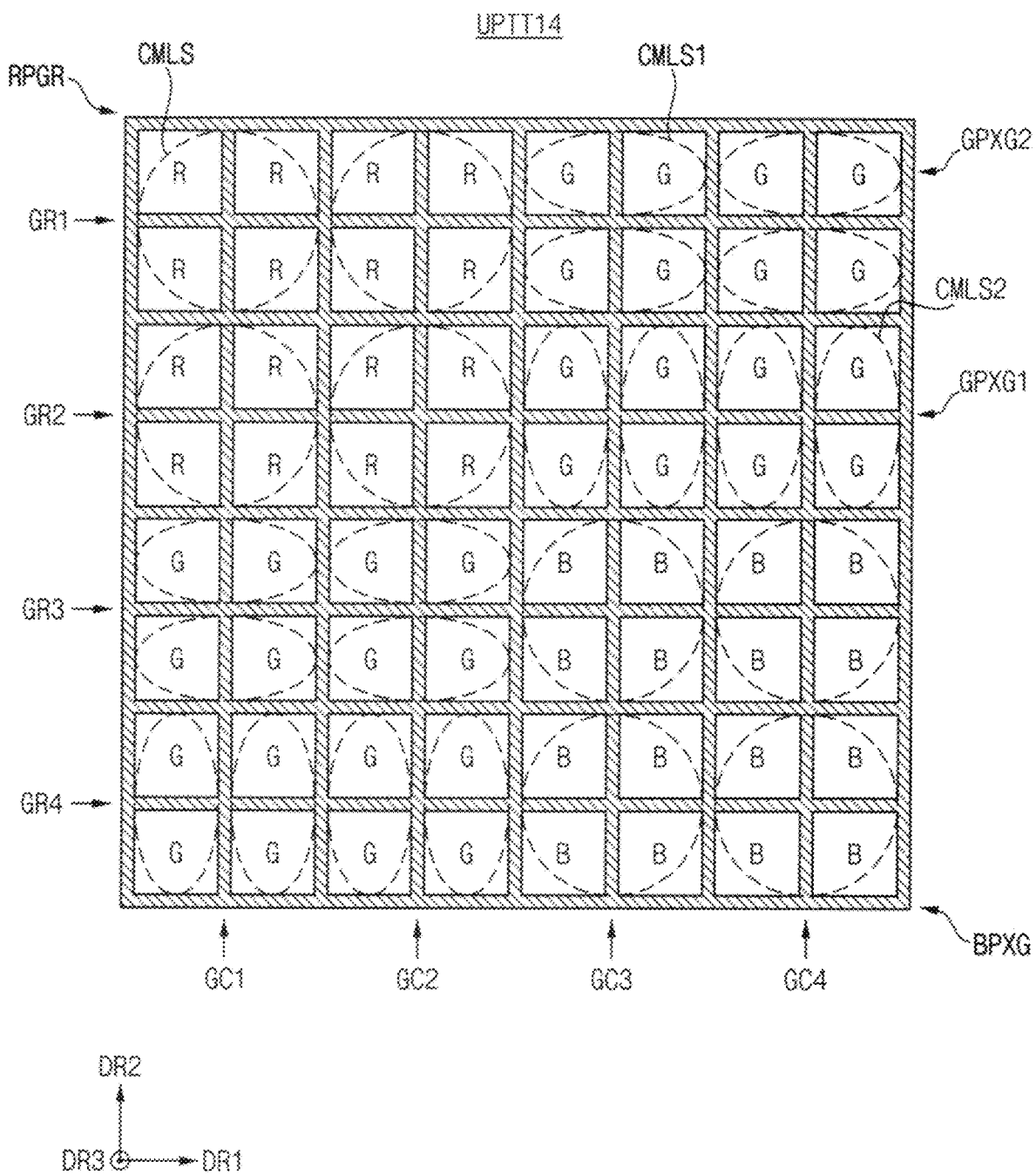
Figure 25C:
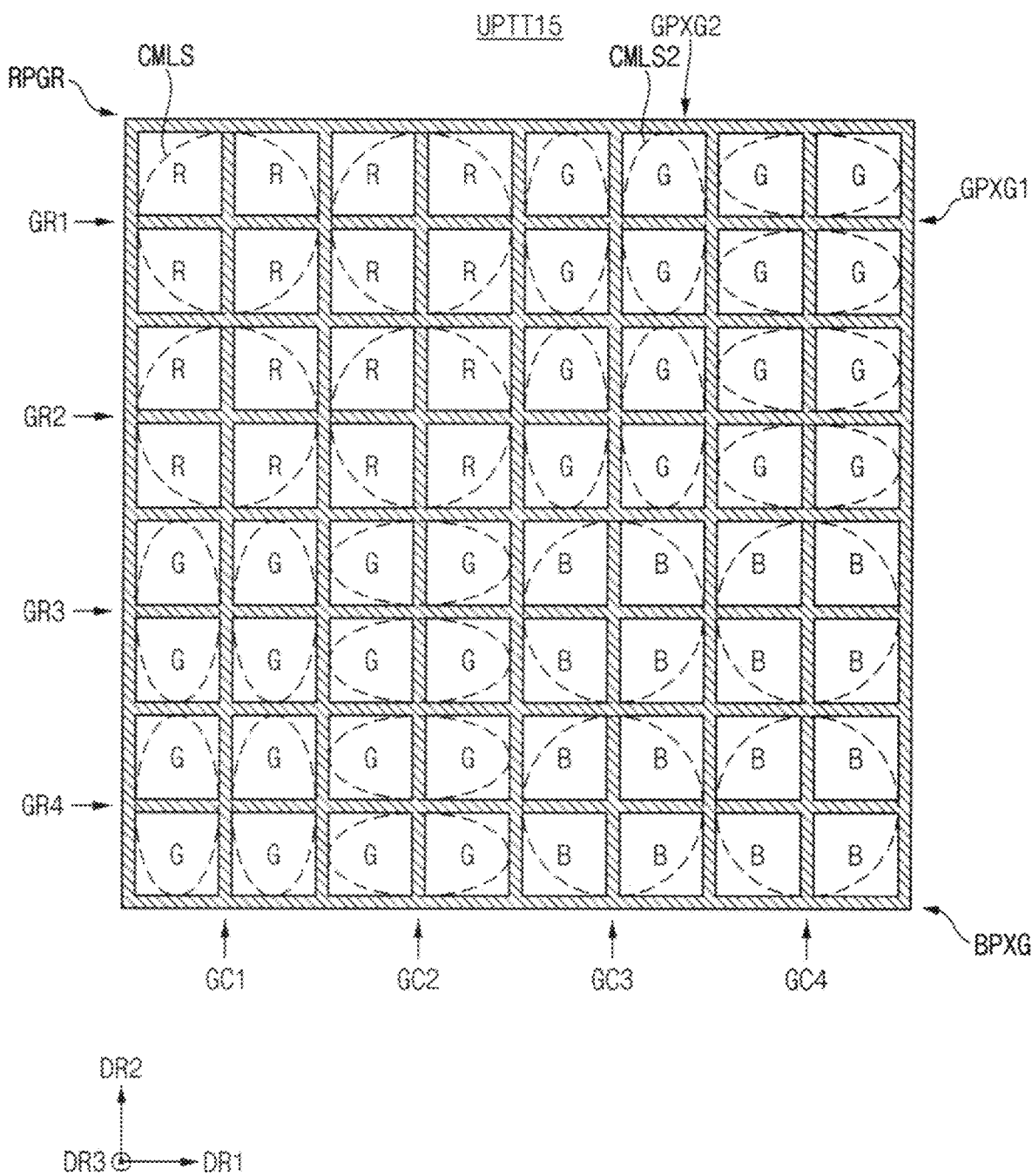

FIGS. 24A and 25C are plan views illustrating example embodiments of a unit pattern including pixel groups and unit pixels included in a pixel array according to example embodiments.

Figure 24B:
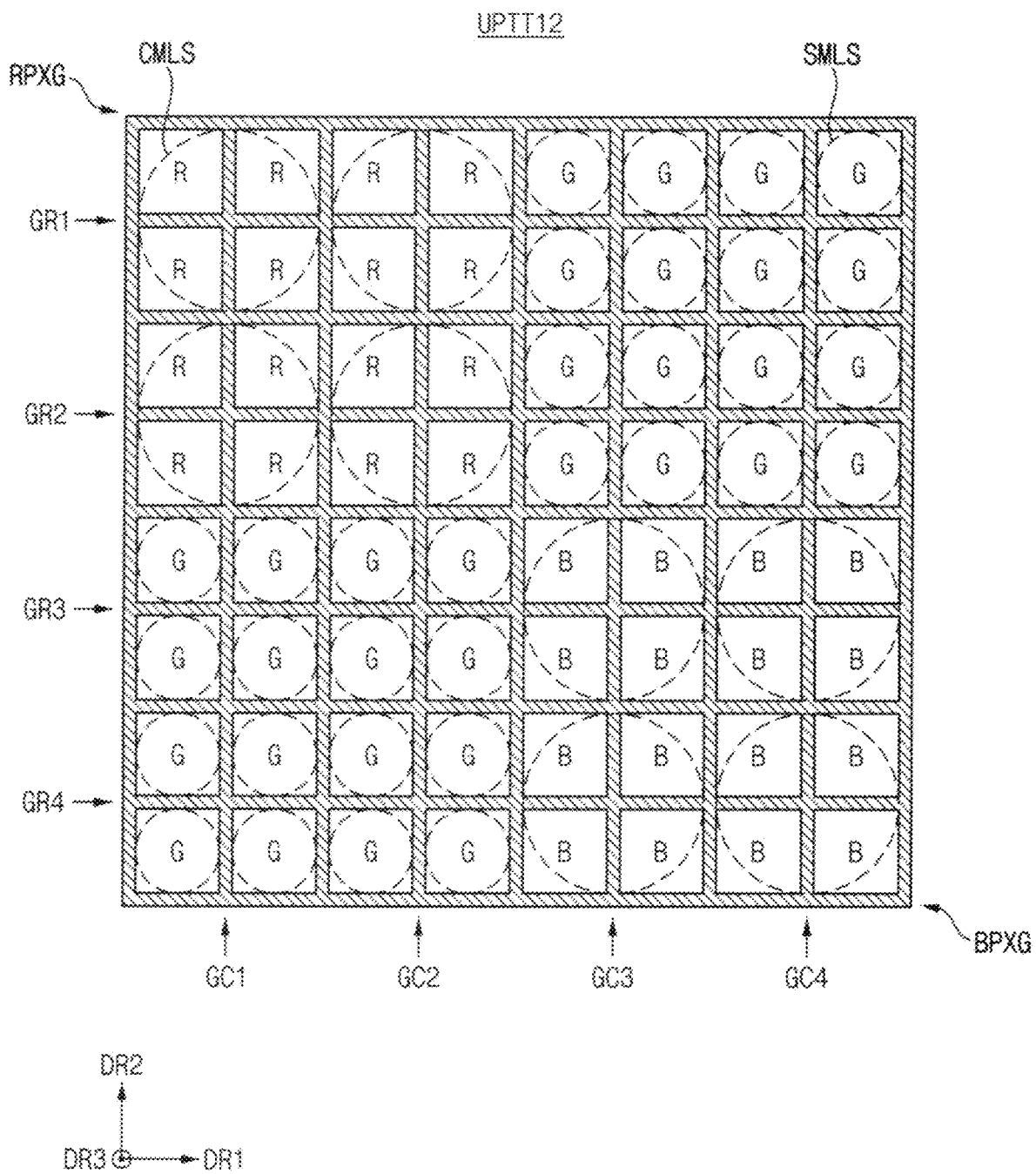

Referring to FIGS. 24A and 24B, each of unit patterns UPTT11 and UPT12 having a mixed structure may include at least one red pixel group RPXG, at least one blue pixel group BPXG, and a plurality of green pixels G. Each red pixel group RPXG may include four red pixels R arranged in a matrix form of two pixel rows and two pixel columns and focused by a single common microlens CMLS. Each blue pixel group BPXG may include four blue pixels B arranged in a matrix form of two pixel rows and two pixel columns and focused by a single common microlens CMLS. Each green pixel G may be focused by each microlens SMLS.

In some example embodiments, as illustrated in FIG. 24A, the unit pattern UPT11 may include the one red pixel group RPXG disposed in the first group row GR1 and the first group column GC1, the one blue pixel group BPXG disposed in the second group row GR2 and the second group column GC2, the four green pixels G arranged in a matrix form in the first group row GR1 and the second group column GC2, and the four green pixels G arranged in a matrix form in the second group row GR2 and the first group column GC1.

In some example embodiments, as illustrated in FIG. 24B, the unit pattern UPT12 may include the four red pixel groups RPXG arranged in a matrix form of first and second group rows GR1 and GR2 and the first and second group columns GC1 and GC2, the four blue pixel groups BPXG arranged in a matrix form of third and fourth group rows GR3 and GR4 and the third and fourth group columns GC3 and GC4, the sixteen green pixels G arranged in a matrix form in the first and second group rows GR1 and GR2 and the third and fourth group columns GC3 and GC4, and the sixteen green pixels G arranged in a matrix form in the third and fourth group rows GR3 and GR4 and the first and second group columns GC1 and GC2.

In comparison with the unit patterns UPTT1 and UPTT8 of FIGS. 21A and 23A, each common microlens CMLS corresponding to the four green pixels G sharing the same color filter in each green pixel group GPXG may be substituted with the four individual microlenses SMLS in the unit patterns UPTT11 and UPTT12 of FIGS. 24A and 24B. As such, the performance of auto focusing and the image resolution may be determined properly by adjusting the ratio and the arrangement of pixel groups focused by the common microlens CMLS and the individual unit pixels focused by the individual microlens SMLS.

Referring to FIGS. 25A through 25C, each of unit patterns UPTT13 and UPT15 having a mixed structure may include at least one red pixel group RPXG, at least one blue pixel group BPXG, at least one row green pixel group GPXG1 and at least one column green pixel group GPXG2. Each red pixel group RPXG may include four red pixels R arranged in a matrix form of two pixel rows and two pixel columns and focused by a single common microlens CMLS. Each blue pixel group BPXG may include four blue pixels B arranged in a matrix form of two pixel rows and two pixel columns and focused by a single common microlens CMLS. Each row green pixel group GPXG1 may include two green pixels G arranged in a matrix form of one pixel row and two pixel columns and focused by a single common microlens CMLS1 of an ellipse shape having a major axis in the first horizontal direction DR1. Each column green pixel group GPXG2 may include two green pixels G arranged in a matrix form of two pixel rows and one pixel column and focused by a single common microlens CMLS2 of an ellipse shape having a major axis in the second horizontal direction DR2. Two row green pixel groups GPXG1, which are arranged adjacent in the second horizontal direction DR2, may form one pair, and column green pixel groups GPXG2, which are arranged adjacent in the first horizontal direction DR1, may form one pair.

In some example embodiments, as the unit pattern UPTT13 illustrated in FIG. 25A, two pairs of the row green pixel groups GPXG1 may be arranged adjacent in one diagonal direction and two pairs of the column green pixel groups GPXG2 may be arranged adjacent in the other diagonal direction.

In some example embodiments, as the unit pattern UPTT14 illustrated in FIG. 25B, two pairs of the row green pixel groups GPXG1 may be arranged adjacent in the first horizontal direction DR1, and two pairs of the column green pixel groups GPXG2 may be arranged adjacent in the first horizontal direction DR1.

In some example embodiments, as the unit pattern UPTT15 illustrated in FIG. 25C, two pairs of the row green pixel groups GPXG1 may be arranged adjacent in the second horizontal direction DR2, and two pairs of the column green pixel groups GPXG2 may be arranged adjacent in the second horizontal direction DR2.

In comparison with the unit patterns UPTT1 and UPTT8 of FIGS. 21A and 23A, each common microlens CMLS corresponding to the four green pixels G sharing the same color filter in each green pixel group GPXG may be substituted with the two common microlens CMLS1 or CMLS2 in the unit patterns UPTT13 through UPTT15 of FIGS. 25A through 20C. As such, the performance of auto focusing and the image resolution may be determined properly by adjusting the ratio and the arrangement of pixel groups focused by the common microlens CMLS, CMLS1 and CML2 of the various sizes.

Figure 26:
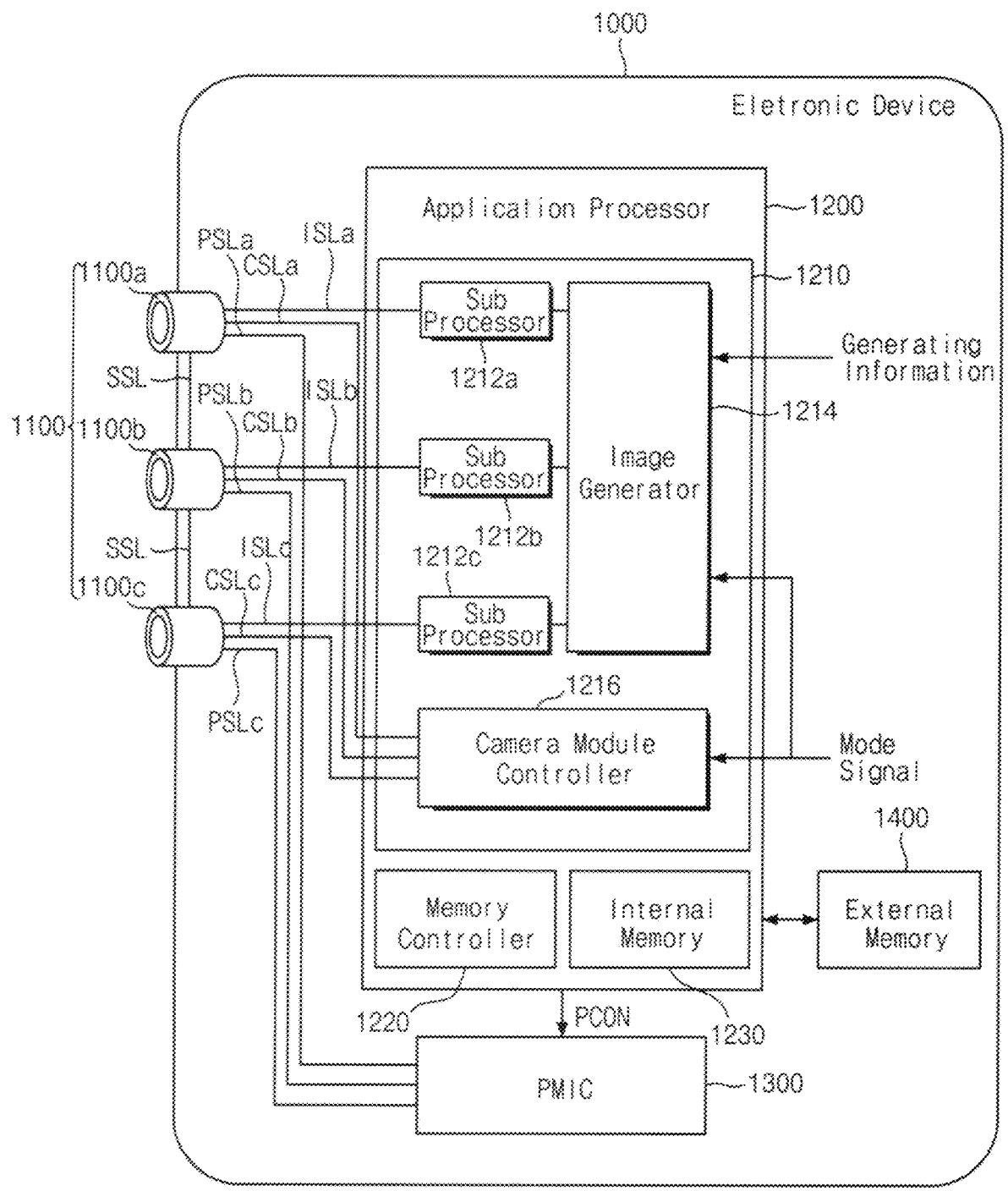
FIG. 26 is a block diagram illustrating an electronic device according to example embodiments.
Figure 27:
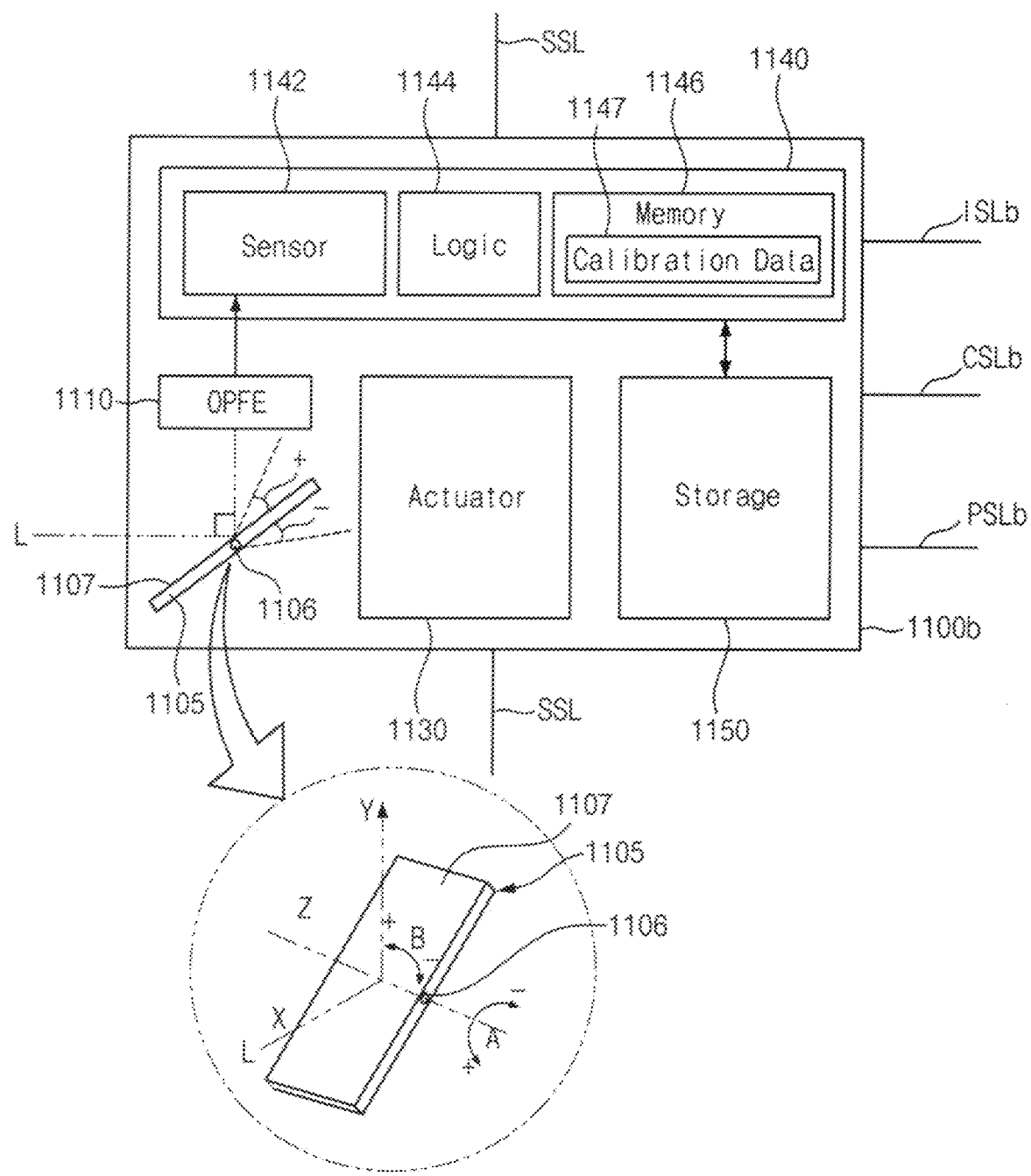
FIG. 27 is a block diagram illustrating a camera module included in the electronic device of FIG. 26.

FIG. 26 is a block diagram illustrating an electronic device according to example embodiments, and FIG. 27 is a block diagram illustrating a camera module included in the electronic device of FIG. 26.

Referring to FIG. 26, an electronic device 1000 may include a camera module group 1100, and application processor 1200, a power management integrated circuit (PMIC) 1300 and/or an external memory 1400.

The camera module group 1100 may include a plurality of camera modules 1100a, 1100b and 1100c. FIG. 26 illustrates the three camera modules 1100a, 1100b and 1100c as an example, but example embodiments are not limited to a particular number of camera modules. According to example embodiments, the camera module group 1100 may include two camera modules, and four or more camera modules.

Hereinafter, an example configuration of the camera module 1100b is described with reference to FIG. 27. According to example embodiments, the same descriptions may be applied to the other camera modules 1100a and 1100c.

Referring to FIG. 27, the camera module 1100b may include a prism 1105, an optical path folding element (OPFE) 1110, an actuator 1130, an image sensing device 1140 and a storage device 1150.

The prism 1105 may include a reflection surface 1107 to change a path of a light L incident on the prism 1105.

In some example embodiments, the prism 1105 may change the path of the light L incident in a first direction X to the path in a second direction Y perpendicular to the first direction X. In addition, the prism 1105 may rotate the reflection surface 1107 around a center axis 1106 and/or rotate the center axis 1106 in the B direction to align the path of the reflected light along the second direction Y. In addition, the OPFE 1110 may move in a third direction perpendicular to the first direction X and the second direction Y.

In some example embodiments, a rotation angle of the prism 1105 may be smaller than 15 degrees in the positive (+) A direction and greater than 15 degrees in the negative (−) A direction, but example embodiments are not limited thereto.

In some example embodiments, the prism 1105 may rotate within 20 degrees in the positive B direction and the negative B direction.

In some example embodiments, the prism 1105 may move the reflection surface 1106 in the third direction Z that is in parallel with the center axis 1106.

The OPFE 1110 may include optical lenses that are divided into m groups where m is a positive integer. The m lens group may move in the second direction Y to change an optical zoom ratio of the camera module 1100b. For example, the optical zoom ratio may be changed in a range of 3K, 5K, and so on by moving the m lens group, when K is a basic optical zoom ratio of the camera module 1100b.

The actuator 1130 may move the OPFE 1110 or the optical lens to a specific position. For example, the actuator 1130 may adjust the position of the optical lens for accurate sensing such that an image sensor 1142 may be located at a position corresponding to a focal length of the optical lens.

The image sensing device 1140 may include the image sensor 1142, a control logic 1144 and/or a memory 1146. The image sensor 1142 may capture or sense an image using the light provided through the optical lens. The control logic 1144 may control overall operations of the camera module 1100b. For example, the control logic 1144 may provide control signals through control signal line CSLb to control the operation of the camera module 1100b.

The memory 1146 may store information such as calibration data 1147 for the operation of the camera module 1100b. For example, the calibration data 1147 may include information for generation of image data based on the provided light, such as information on the above-described rotation angle, a focal length, information on an optical axis, and so on. When the camera module 1100b is implemented as a multi-state camera having a variable focal length depending on the position of the optical lens, the calibration data 1147 may include multiple focal length values and auto-focusing values corresponding to the multiple states.

The storage device 1150 may store the image data sensed using the image sensor 1142. The storage device 1150 may be disposed outside of the image sensing device 1140, and the storage device 1150 may be stacked with a sensor chip comprising the image sensing device 1140. The storage device 1150 may be implemented with an electrically erasable programmable read-only memory (EEPROM), but example embodiments are not limited thereto.

Referring to FIGS. 26 and 27, each of the camera modules 1100a, 1100b and 1100c may include the actuator 1130. In some example embodiments, the camera modules 1100a, 1100b and 1100c may include the same or different calibration data 1147 depending on the operations of the actuators 1130.

In some example embodiments, one camera module 1100b may have a folded lens structure included the above-described prism 1105 and the OPFE 1110, and the other camera modules 1100a and 1100b may have a vertical structure without the prism 1105 and the OPFE 1110.

In some example embodiments, one camera module 1100c may be a depth camera configured to measure distance information of an object using an infrared light. In some example embodiments, the application processor 1200 may merge the distance information provided from the depth camera 1100c and image data provided from the other camera modules 1100a and 1100b to generate a three-dimensional depth image.

In some example embodiments, at least two camera modules among the camera modules 1100a, 1100b and 1100c may have different field of views, for example, through different optical lenses.

In some example embodiments, each of the camera modules 1100a, 1100b and 1100c may be separated physically from each other. In other words, the camera modules 1100a, 1100b and 1100c may each include a dedicated image sensor 1142.

The application processor 1200 may include an image processing device 1210, a memory controller 1220 and an internal memory 1230. The application processor 1200 may be separated from the camera modules 1100a, 1100b and 1100c. For example, the application processor 1200 may be implemented as one chip and the camera modules 1100a, 1100b and 1100c may implemented as another chip or other chips.

The image processing device 1210 may include a plurality of sub processors 1212a, 1212b and 1212c, an image generator 1214 and a camera module controller 1216.

The image data generated by the camera modules 1100a, 1100b and 1100c may be provided to the sub processors 1212a, 1212b and 1212c through distinct image signal lines ISLa, ISLb and ISLc, respectively. For example, the transfer of the image data may be performed using a camera serial interface (CSI) based on the mobile industry processor interface (MIPI), but example embodiments are not limited thereto.

In some example embodiments, one sub processor may be assigned commonly to two or more camera modules. In some example embodiments, a multiplexer may be used to transfer the image data selectively from one of the camera modules to the shared sub processor.

The image data from the sub processors 1212a, 1212b and 1212c may be provided to the image generator 1214. The image generator 1214 may generate an output image using the image data from the sub processors 1212a, 1212b and 1212c according to image generating information or a mode signal. For example, the image generator 1213 may merge at least a portion of the image data from the camera modules 1100a, 1100b and 1100c having the different fields of view to generate the output image according to the image generating information or the mode signal. In addition, the image generator 1214 may select, as the output image, one of the image data from the camera modules 1100a, 1100b and 1100c according to the image generating information or the mode signal.

In some example embodiments, the image generating information may include a zoom factor or a zoom signal. In some example embodiments, the mode signal may be a signal based on a selection of a user.

When the image generating information is the zoom factor and the camera modules 1100a, 1100b and 1100c have the different field of views, the image generator 1214 may perform different operation depending on the zoom signal. For example, when the zoom signal is a first signal, the image generator 1214 may merge the image data from the different camera modules to generate the output image. When the zoom signal is a second signal different from the first signal, the image generator 1214 may select, as the output image, one of image data from the camera modules 1100a, 1100b and 1100c.

In some example embodiments, the image generator 1214 may receive the image data of different exposure times from the camera modules 1100a, 1100b and 1100c. In some example embodiments, the image generator 1214 may perform high dynamic range (HDR) processing with respect to the image data from the camera modules 1100a, 1100b and 1100c to generate the output image having the increased dynamic range.

The camera module controller 1216 may provide control signals to the camera modules 1100a, 1100b and 1100c. The control signals generated by the camera module controller 1216 may be provided to the camera modules 1100a, 1100b and 1100c through the distinct control signal lines CSLa, CSLb and CSLc, respectively.

In some example embodiments, one of the camera modules 1100a, 1100b and 1100c may be designated as a master camera according to the image generating information of the mode signal, and the other camera modules may be designated as slave cameras.

The camera module acting as the master camera may be changed according to the zoom factor or an operation mode signal. For example, when the camera module 1100a has the wider field of view than the camera module 1100b and the zoom factor indicates a lower zoom magnification, the camera module 1100b may be designated as the master camera. In contrast, when the zoom factor indicates a higher zoom magnification, the camera module 1100a may be designated as the master camera.

In some example embodiments, the control signals provided from the camera module controller 1216 may include a synch enable signal. For example, when the camera module 1100b is the master camera and the camera modules 1100a and 1100c are the slave cameras, the camera module controller 1216 may provide the synch enable signal to the camera module 1100b. The camera module 1100b may generate a synch signal based on the provided synch enable signal and provide the synch signal to the camera modules 1100a and 1100c through a synch signal line SSL. As such, the camera modules 1100a, 1100b and 1100c may transfer the synchronized image data to the application processor 1200 based on the synch signal.

In some example embodiments, the control signals provided from the camera module controller 1216 may include information on the operation mode. The camera modules 1100a, 1100b and 1100c may operate in a first operation mode or a second operation mode based on the information from the camera module controller 1216.

In the first operation mode, the camera modules 1100a, 1100b and 1100c may generate image signals with a first speed (e.g., a first frame rate) and encode the image signals with a second speed higher than the first speed (e.g., a second frame rate higher than the first frame rate) to transfer the encoded image signals to the application processor 1200. The second speed may be lower than thirty times the first speed. The application processor 1200 may store the encoded image signals in the internal memory 1230 or the external memory 1400. The application processor 1200 may read out and decode the encoded image signals to provide display data to a display device. For example, the sub processors 1212a, 1212b and 1212c may perform the decoding operation and the image generator 1214 may process the decoded image signals.

In the second operation mode, the camera modules 1100a, 1100b and 1100c may generate image signals with a third speed lower than the first speed (e.g., the third frame rate lower than the first frame rate) to transfer the generated image signals to the application processor 1200. In other words, the image signals that are not encoded may be provided to the application processor 1200. The application processor 1200 may process the received image signals or store the receive image signals in the internal memory 1230 or the external memory 1400.

The PMIC 1300 may provide a power supply voltage to the camera modules 1100a, 1100b and 1100c, respectively. For example, the PMIC 1300 may provide, under control of the application processor 1200, a first power to the camera module 1100a through a power line PSLa, a second power to the camera module 1100b through a power line PSLb, and a third power to the camera module 1100c through a power line PSLc.

The PMIC 1300 may generate the power respectively corresponding to the camera modules 1100a, 1100b and 1100c and control power levels, in response to a power control signal PCON from the application processor 1200. The power control signal PCON may include information on the power depending on the operation modes of the camera modules 1100a, 1100b and 1100c. For example, the operation modes may include a low power mode in which the camera modules 1100a, 1100b and 1100c operate in low powers. The power levels of the camera modules 1100a, 1100b and 1100c may be the same as or different from each other. In addition, the power levels may be changed dynamically or adaptively.

As described above, the pixel array and the image sensor including the pixel group according to example embodiments may enhance an image quality by increasing sensing sensitivity of the unit pixel through the shared structure of the floating diffusion region and the symmetric structure of the vertical transfer gates. In addition, the pixel group according to example embodiments may reduce cross-talk between the unit pixels and further enhance the image quality through the trench structure extending in the vertical direction from the upper surface of the semiconductor substrate and to the lower surface of the semiconductor substrate. In addition, the pixel array and the image sensor including the pixel group according to example embodiments may more efficiently implement a high dynamic range (HDR) through independent driving of the two vertical transfer gates in each unit pixel.

One or more of the elements disclosed above may include or be implemented in one or more processing circuitries such as hardware including logic circuits; a hardware/software combination such as a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The example embodiments may be applied to any electronic devices and systems including an image sensor. For example, the example embodiments may be applied to systems such as a mobile phone, a smart phone, a personal digital assistant (PDA), a portable multimedia player (PMP), a digital camera, a camcorder, a personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, an augmented reality (AR) device, a vehicle navigation device, a video phone, a monitoring system, an auto focusing system, a tracking system, a motion detection system, etc.

The foregoing is illustrative of example embodiments and is not to be construed as limiting thereof. Although a few example embodiments have been described, those skilled in the art will readily appreciate that many modifications are possible in the example embodiments without materially departing from the example embodiments.

What is claimed is:

1. A pixel group of an image sensor, the pixel group comprising:
   first through fourth unit pixels in a matrix form of two pixels rows and two pixel columns; and
   a common floating diffusion region in a semiconductor substrate at a center of the pixel group and shared by the first through fourth unit pixels,
   each of the first through fourth unit pixels comprising:
      a photoelectric conversion element in the semiconductor substrate; and
      a pair of vertical transfer gates in the semiconductor substrate and extending in a vertical direction perpendicular to a surface of the semiconductor substrate, the pair of vertical transfer gates configured to transfer photo charges collected by the photoelectric conversion element to the common floating diffusion region, and the pair of vertical transfer gates are configured to be activated simultaneously to perform a low-luminance sensing.

2. The pixel group of claim 1, wherein the pair of vertical transfer gates included in each unit pixel are electrically insulated from each other.

3. The pixel group of claim 1, wherein the pair of vertical transfer gates included in each unit pixel are controlled independently of each other by a pair of transfer control signals.

4. The pixel group of claim 3, wherein only one of the pair of vertical transfer gates is configured to be activated to perform a high-luminance sensing.

5. The pixel group of claim 1, wherein two intersection lines of a horizontal plane perpendicular to the vertical direction and two vertical surfaces of the pair of vertical transfer gates facing each other are parallel.

6. The pixel group of claim 1, further comprising:
   trench structures in the semiconductor substrate and extending in the vertical direction from an upper surface of the semiconductor substrate and to a lower surface of the semiconductor substrate to electrically and optically separate the first through fourth unit pixels.

7. The pixel group of claim 6, wherein the trench structures includes:
   inter-group trench structures separating the pixel group from other pixel groups; and
   inter-pixel trench structures separating the first through fourth unit pixels included in the pixel group from each other.

8. The pixel group of claim 7, wherein the inter-pixel trench structures includes:
   a first inter-pixel trench structure extending in a first horizontal direction to be connected to the inter-group trench structures at both sides of the pixel group in the first horizontal direction and extending in the vertical direction from the upper surface of the semiconductor substrate to the lower surface of the semiconductor substrate; and
   a second inter-pixel trench structure extending in a second horizontal direction perpendicular to the first horizontal direction to be connected to the inter-group trench structures both sides of the pixel group in the second horizontal direction and extending in the vertical direction from the upper surface of the semiconductor substrate to the lower surface of the semiconductor substrate.

9. The pixel group of claim 8, wherein at least a portion of the first inter-pixel trench structure and at least a portion of the second inter-pixel trench structure are removed in a cross region of the first inter-pixel trench structure and the second inter-pixel trench structure, and the common floating diffusion region is at the cross region.

10. The pixel group of claim 9, wherein an entire portion of the first inter-pixel trench structure corresponding to the cross region and an entire portion of the second inter-pixel trench structure corresponding the cross region are removed from the upper surface of the semiconductor substrate to the lower surface of the semiconductor substrate.

11. The pixel group of claim 9, wherein only a portion of the first inter-pixel trench structure corresponding to the cross region and only a portion of the second inter-pixel trench structure corresponding to the cross region are removed near the upper surface of the semiconductor substrate.

12. The pixel group of claim 1, further comprising:
   a common microlens above or below the semiconductor substrate, the common microlens covering all of the first through fourth photoelectric conversion elements respectively included in the first through fourth unit pixels, the common microlens configured to focus an incident light to the first through fourth photoelectric conversion elements.

13. The pixel group of claim 1, further comprising:
   two common microlens of an ellipse shape above or below the semiconductor substrate, each of the two common microlens of the ellipse shape covering two of first through fourth photoelectric conversion elements respectively included in the first through fourth unit pixels, the two common microlens configured to focus an incident light to the two of the first through fourth photoelectric conversion elements.

14. The pixel group of claim 1, further comprising:
   a single color filter shared by the first through fourth unit pixels.

15. A pixel array of an image sensor, the pixel array comprising:
   a plurality of pixel groups, each pixel group comprising:
      first through fourth unit pixels in a matrix form of two pixels rows and two pixel columns; and
      a common floating diffusion region in a semiconductor substrate at a center of each pixel group and shared by the first through fourth unit pixels,
      each of the first through fourth unit pixels comprising:
         a photoelectric conversion element in the semiconductor substrate; and
         a pair of vertical transfer gates in the semiconductor substrate and extending in a vertical direction perpendicular to a surface of the semiconductor substrate, the pair of vertical transfer gates configured to transfer photo charges collected by the photoelectric conversion element to the common floating diffusion region, and the pair of vertical transfer gates are configured to be activated simultaneously to perform a low-luminance sensing.

16. The pixel array of claim 15, wherein the pair of vertical transfer gates included in each unit pixel are electrically insulated from each other, and controlled independently of each other by a pair of transfer control signals.

17. The pixel array of claim 15, wherein the pixel array is divided into unit patterns arranged repeatedly in a first horizontal direction and a second horizontal direction perpendicular to the first horizontal direction, and each of the unit patterns include two or more pixel groups.

18. The pixel array of claim 17, wherein the unit pattern includes:
   first through fourth pixel groups in a matrix form of two group rows and two group columns.

19. The pixel array of claim 17, wherein the unit pattern include:
   first through fourth pixel groups in a matrix form of a first group row, a second group row, a first group column and a second group column;
   fifth through eighth pixel groups in a matrix form of the first group row, the second group row, a third group column and a fourth group column;
   ninth through twelfth pixel groups in a matrix form of a third group row, a fourth group row, the first group column and the second group column; and
   thirteenth through sixteenth pixel groups in a matrix form of the third group row, the fourth group row, the third group column and the fourth group column.

20. An image sensor comprising:
   a pixel array including a plurality of pixel groups configured to collect photo charges generated by an incident light;
   a row driver configured to drive the pixel array row by row; and
   a controller configured to control the pixel array and the row driver, each pixel group comprising:
   first through fourth unit pixels in a matrix form of two pixels rows and two pixel columns; and
   a common floating diffusion region in a semiconductor substrate at a center of each pixel group and shared by the first through fourth unit pixels,
   each of the first through fourth unit pixels comprising:
      a photoelectric conversion element in the semiconductor substrate; and
      a pair of vertical transfer gates in the semiconductor substrate and extending in a vertical direction perpendicular to a surface of the semiconductor substrate, the pair of vertical transfer gates configured to transfer photo charges collected by the photoelectric conversion element to the common floating diffusion region, and the pair of vertical transfer gates are configured to be activated simultaneously to perform low-luminance sensing.

* * * * *